(12) United States Patent
Takenaka et al.

(10) Patent No.: US 9,461,602 B2
(45) Date of Patent: Oct. 4, 2016

(54) POWER AMPLIFIER MODULE

(71) Applicant: Murata Manufacturing Co., Ltd., Kyoto (JP)

(72) Inventors: Kiichiro Takenaka, Kyoto (JP); Masahiro Ito, Kyoto (JP); Masakazu Hori, Kyoto (JP); Mitsuo Ariie, Kyoto (JP); Hayato Nakamura, Kyoto (JP); Satoshi Arayashiki, Kyoto (JP); Hidetoshi Matsumoto, Kyoto (JP); Tsuyoshi Sato, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 15 days.

(21) Appl. No.: 14/327,779

(22) Filed: Jul. 10, 2014

(65) Prior Publication Data
US 2015/0035607 A1 Feb. 5, 2015

(30) Foreign Application Priority Data

Jul. 31, 2013 (JP) .................................. 2013-159360
Feb. 24, 2014 (JP) .................................. 2014-033147

(51) Int. Cl.
*H03G 3/20* (2006.01)
*H03F 3/191* (2006.01)
(Continued)

(52) U.S. Cl.
CPC .............. *H03F 3/21* (2013.01); *H03F 1/0261* (2013.01); *H03F 1/32* (2013.01); *H03F 1/52* (2013.01);
(Continued)

(58) Field of Classification Search
CPC .............. H03F 1/02; H03F 1/42; H03F 1/56; H03F 3/04; H03F 3/191; H03G 11/00; H03H 7/38; H03H 11/28
USPC ......... 330/9, 11, 73, 74, 123, 127, 129, 130, 330/131, 133, 134, 135, 140, 254, 261, 267, 330/273, 278, 279, 285, 296, 297, 302, 330/306; 455/127.2, 127.3, 136, 232.1, 455/233.1, 251.1
See application file for complete search history.

(56) References Cited

U.S. PATENT DOCUMENTS 6,798,286 B2 * 9/2004 Dauphinee ......... G01R 31/2607
257/E21.525
7,839,213 B2 * 11/2010 de Graauw .............. H03C 5/00
330/10
(Continued)

FOREIGN PATENT DOCUMENTS

JP 03-276912 A 12/1991
JP 04-037302 A 2/1992

OTHER PUBLICATIONS

Tombak, Ali et al. "High-Efficiency Cellular Power Amplifiers Based on a Modified LDMOS Process on Bulk Silicon and Silicon-On-Insulator Substrates With Integrated Power Management Circuitry" IEEE Transactions on Microwave Theory and Techniques, vol. 60, No. 6, Dated Jun. 2012.

*Primary Examiner* — Steven J Mottola
*Assistant Examiner* — Hafizur Rahman
(74) *Attorney, Agent, or Firm* — Pearne & Gordon LLP

(57) ABSTRACT

Improvement in linearity is achieved at low costs in a power amplifier module employing an envelope tracking system. The power amplifier module includes a first power amplifier circuit that amplifies a radio frequency signal and that outputs a first amplified signal, a second power amplifier circuit that amplifies the first amplified signal on the basis of a source voltage varying depending on amplitude of the radio frequency signal and that outputs a second amplified signal, and a matching circuit that includes first and second capacitors connected in series between the first and second power amplifier circuit and an inductor connected between a node between the first and second capacitors and a ground and that decreases a gain of the first power amplifier circuit as the source voltage of the second power amplifier circuit increases.

16 Claims, 25 Drawing Sheets

(51) Int. Cl.
*H03F 3/21* (2006.01)
*H03F 1/02* (2006.01)
*H03F 1/32* (2006.01)
*H03F 1/52* (2006.01)
*H03F 3/19* (2006.01)

(52) U.S. Cl.
CPC ........... *H03F 3/19* (2013.01); *H03F 2200/102* (2013.01); *H03F 2200/408* (2013.01); *H03F 2200/411* (2013.01); *H03F 2200/444* (2013.01); *H03F 2200/451* (2013.01)

(56) References Cited

U.S. PATENT DOCUMENTS

| | | | |
|---|---|---|---|
| 8,433,263 B2* | 4/2013 | Pratt | H03F 1/3247 330/149 |
| 2014/0100002 A1* | 4/2014 | Dupuis | H03G 3/3042 455/571 |
| 2014/0184337 A1* | 7/2014 | Nobbe | H03F 1/0227 330/296 |

* cited by examiner

POWER AMPLIFIER MODULE

BACKGROUND OF THE INVENTION

1. Field of the Invention

The present invention relates to a power amplifier module.

2. Description of Related Art

In a mobile communication apparatus such as a mobile phone, a power amplifier circuit (power-amp) is used to amplify power of a signal to be transmitted to a base station. In recent years, mobile phones have employed modulation methods such as high speed uplink packet access (HSUPA), long-term evolution (LTE), and LTE-advanced which are high-speed data communication standards. In such communication standards, in order to improve a communication rate, it is important to reduce a distortion in phase or amplitude. That is, high linearity is required for a power amplifier circuit. In such communication standards, in order to improve the communication rate, a range (dynamic range) in which the amplitude of a signal varies may be broadened. When the dynamic range is broad, a high source voltage is required for enhancing linearity and thus there is a tendency that power consumption in the power amplifier circuit increases.

On the other hand, in mobile phones, a decrease in power consumption is required for extending an available time for calling or communication. For example, Patent Document 1 discloses a linear signal transmitter employing an envelope tracking system which can achieve enhancement of power efficiency by controlling a source voltage of a power amplifier circuit depending on an amplitude level of an input modulation signal.

CITATION LIST

Patent Document

[Patent Document 1] JP3-276912 A

BRIEF SUMMARY OF THE INVENTION

As described above, the enhancement of power efficiency can be achieved by controlling the source voltage of a power amplifier circuit, but the gain of the power amplifier circuit may vary depending on a variation in the source voltage and thus linearity thereof may be deteriorated. Therefore, in the linear signal transmitter disclosed in Patent Document 1, the gain of the linear signal transmitter is controlled to be constant as a whole by adjusting the source voltage to be supplied to a power amplifier circuit in a front stage of a power amplifier circuit which is controlled by envelope tracking.

However, in the configuration disclosed in Patent Document 1, a control circuit for controlling the source voltage of the front-stage power amplifier circuit is required in addition to a circuit for envelope tracking control, thereby causing an increase in cost.

The present invention is made in consideration of the above-mentioned circumstances and an object thereof is to achieve improvement in linearity at low costs in a power amplifier module employing an envelope tracking system.

According to an aspect of the present invention, there is provided a power amplifier module including: a first power amplifier circuit that amplifies a radio frequency signal and that outputs a first amplified signal; a second power amplifier circuit that amplifies the first amplified signal on the basis of a source voltage varying depending on amplitude of the radio frequency signal and that outputs a second amplified signal; and a matching circuit that includes first and second capacitors connected in series between the first and second power amplifier circuit and an inductor connected between a node between the first and second capacitors and a ground and that decreases a gain of the first power amplifier circuit as the source voltage of the second power amplifier circuit increases.

According to the present invention, it is possible to achieve improvement in linearity at low costs in a power amplifier module employing an envelope tracking system.

DETAILED DESCRIPTION OF THE INVENTION

Figure 1:
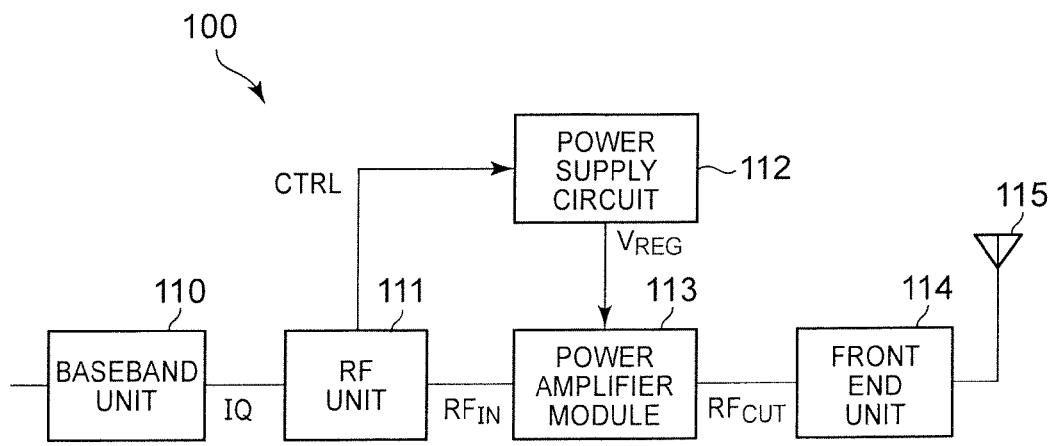
FIG. 1 is a diagram illustrating a configuration example of a transmitter unit including a power amplifier module according to an embodiment of the present invention.

Hereinafter, an embodiment of the present invention will be described with reference to the accompanying drawings. FIG. 1 is a diagram illustrating a configuration example of a transmitter unit including a power amplifier module according to an embodiment of the present invention. The transmitter unit 100 is used to transmit various signals of voice, data, and the like to a base station in a mobile communication apparatus such as a mobile phone. The transmitter unit 100 according to this embodiment copes with plural frequency bands in radio frequency (RF). The mobile communication apparatus also includes a receiver unit for receiving a signal from a base station but description thereof will not be made herein.

As illustrated in FIG. 1, the transmitter unit 100 includes a baseband unit 110, an RF unit 111, a power supply circuit 112, a power amplifier module 113, a front end unit 114, and an antenna 115.

The baseband unit 110 modulates an input signal of voice, data, and the like on the basis of a modulation system such as HSUPA or LTE and outputs a modulation signal. In this embodiment, the modulation signal output from the baseband unit 110 is output as IQ signal (an I signal and a Q signal) of which the amplitude and the phase are expressed in the IQ plane. For example, the frequency of the IQ signal ranges from several MHz to several tens of MHz.

The RF unit 111 generates an RF signal ($RF_{IN}$) to be wirelessly transmitted from the IQ signal output from the baseband unit 110. For example, the frequency of the RF signal ranges from several hundreds of MHz to several GHz. The RF unit 111 detects the amplitude level of the modulation signal on the basis of the IQ signal and outputs a power supply control signal CTRL to the power supply circuit 112 so that the source voltage $D_{REG}$ to be supplied to the power amplifier module 113 has a level corresponding to the amplitude level of the RF signal. That is, RF unit 111 outputs the power supply control signal CTRL so as to perform envelope tracking.

In the RF unit 111, instead of directly converting the IQ signal into the RF signal, the IQ signal may be converted into an intermediate frequency (IF) signal and then the RF signal may be generated from the IF signal.

The power supply circuit 112 generates the source voltage $V_{REG}$ having a level based on the power supply control signal CTRL output from the RF unit 111 and supplies the generated source voltage to the power amplifier module 113. For example, the power supply circuit 112 may include a DC-DC converter that generates the source voltage $V_{REG}$ having a level based on the power supply control signal CTRL from an input voltage (for example, a battery voltage).

The power amplifier module 113 amplifies power of the RF signal ($RF_{IN}$) output from the RF unit 111 up to a level necessary for transmission to a base station on the basis of the source voltage $V_{REG}$ supplied from the power supply circuit 112 and outputs an amplified signal ($RF_{OUT}$).

The front end unit 114 performs filtering on the amplified signal ($RF_{OUT}$), switching with a reception signal received from the base station, or the like. The amplified signal output from the front end unit 114 is transmitted to the base station via the antenna 115.

Figure 2:
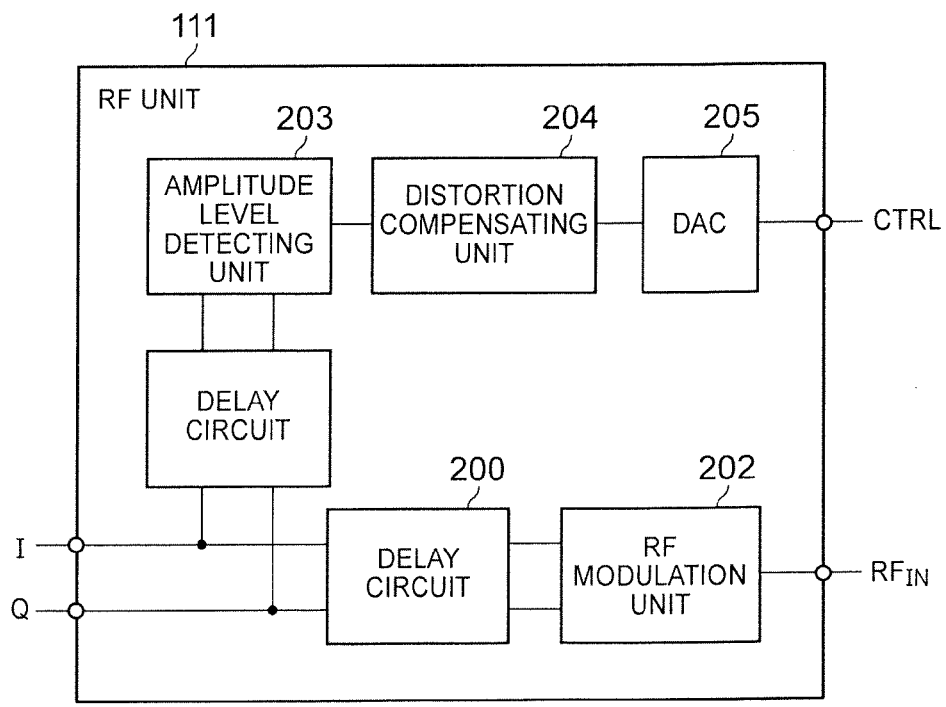
FIG. 2 is a diagram illustrating a configuration example of an RF unit.

FIG. 2 is a diagram illustrating a configuration example of the RF unit 111. As illustrated in FIG. 2, the RF unit 111 includes delay circuits 200 and 201, an RF modulation unit 202, an amplitude level detecting unit 203, a distortion compensating unit 204, and a digital-analog converter (DAC) 205.

The delay circuits 200 and 201 are circuits for delaying the IQ signal for a predetermined time so as to match the timing of inputting the RF signal to the power amplifier module 113 and the timing of supplying the source voltage $V_{REG}$ based on the amplitude level of the RF signal to the power amplifier module 113 with each other.

The RF modulation unit 202 generates and outputs an RF signal from the IQ signal. Specifically, the RF modulation unit 202 can acquire the RF signal, for example, by synthesizing the I signal and a carrier signal through the use of a multiplier, synthesizing the Q signal and the carrier signal having a phase shifted by 90 degrees through the use of a multiplier, and synthesizing the synthesized signals through the use of a subtractor.

The amplitude level detecting unit 203 detects the amplitude level of the modulation signal on the basis of the IQ signal. The detected amplitude level is based on the amplitude level of the RF signal output from the RF modulation unit 202.

The distortion compensating unit 204 adjusts the level of the source voltage $V_{REG}$ so as not to cause an amplitude distortion in the amplified signal at the time of performing envelope tracking. The gain characteristics of a transistor used for the power amplifier module 113 may vary depending on the source voltage $V_{REG}$. Accordingly, in order to maintain linearity in the power amplifier circuit 120, it is necessary to control the source voltage $V_{REG}$ so as to keep the gain constant. For example, the distortion compensating unit 204 may store a table indicating a correlation between the amplitude level of the modulation signal and the level of the source voltage $V_{REG}$ based on the gain characteristics of the transistor. The distortion compensating unit 204 can output the power supply control signal for causing the source voltage $V_{REG}$ to have a level corresponding to the amplitude level of the modulation signal on the basis of the stored table.

The DAC 205 converts the power supply control signal output from the distortion compensating unit 204 into an analog signal and outputs the analog signal.

Figure 3:
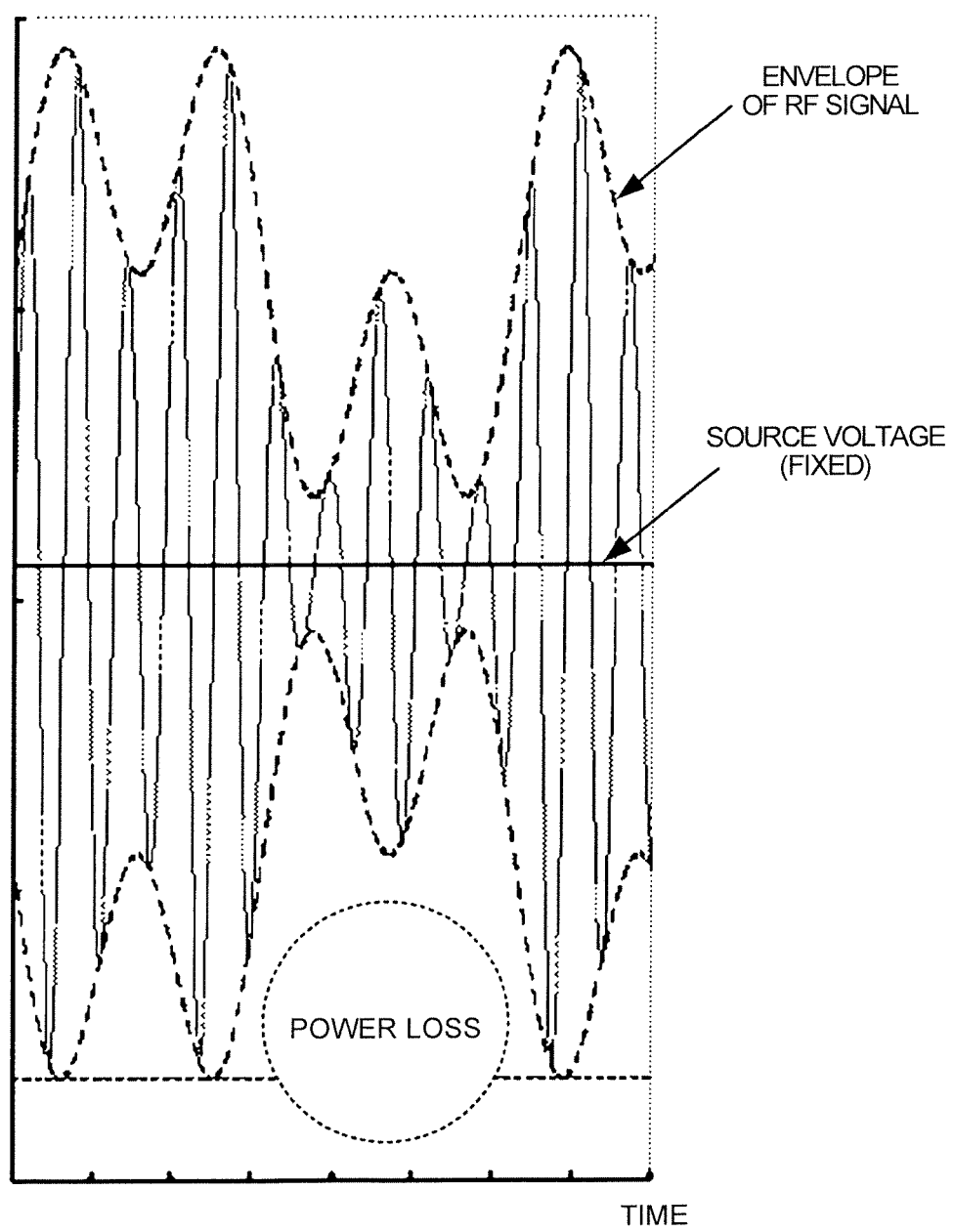
FIG. 3 is a diagram illustrating an example of power loss when power amplification is carried out using a fixed source voltage.

An example of the source voltage control using envelope tracking will be described below with reference to FIGS. 3 and 4. FIG. 3 illustrates an example of power loss when power amplification is carried out using a fixed source voltage. As illustrated in FIG. 3, when the amplitude level of the RF signal greatly varies and the fixed source voltage matched with the maximum amplitude level of the RF signal is employed, the power loss in a section in which the amplitude level of the RF signal is small is large.

Figure 4:
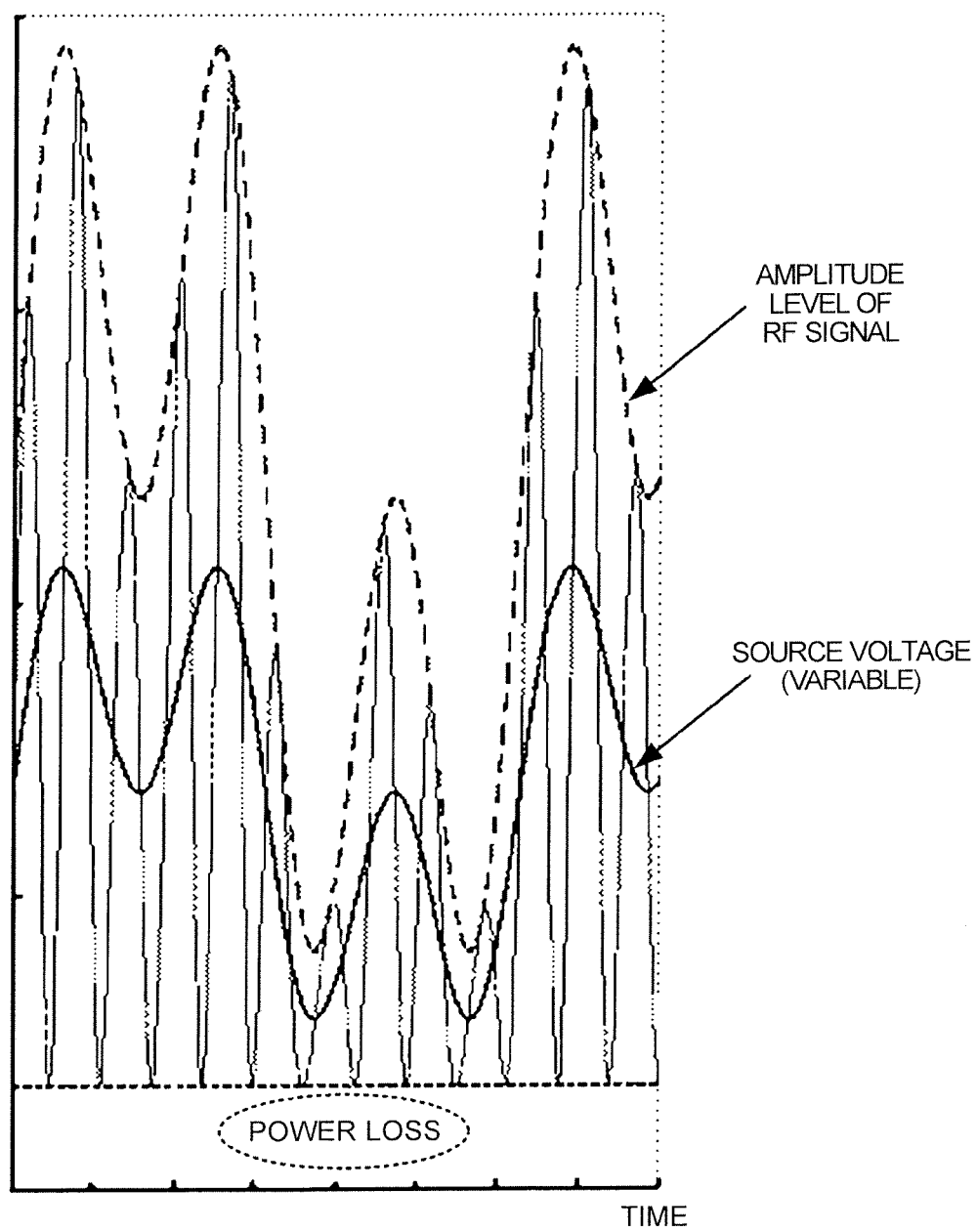
FIG. 4 is a diagram illustrating an example of power loss when power amplification is carried out using a variable source voltage based on envelope tracking.

FIG. 4 illustrates an example of the power loss when power amplification is carried out using a variable source voltage using envelope tracking. As illustrated in FIG. 4, it is possible to reduce the power loss by causing the source voltage to vary depending on the amplitude level of the RF signal.

In this embodiment, the power supply circuit 112 controls the source voltage $V_{REG}$ to be supplied to the power amplifier circuit 113 to a level corresponding to the amplitude level of the RF signal on the basis of the power supply control signal output from the RF unit 111.

Figure 5:
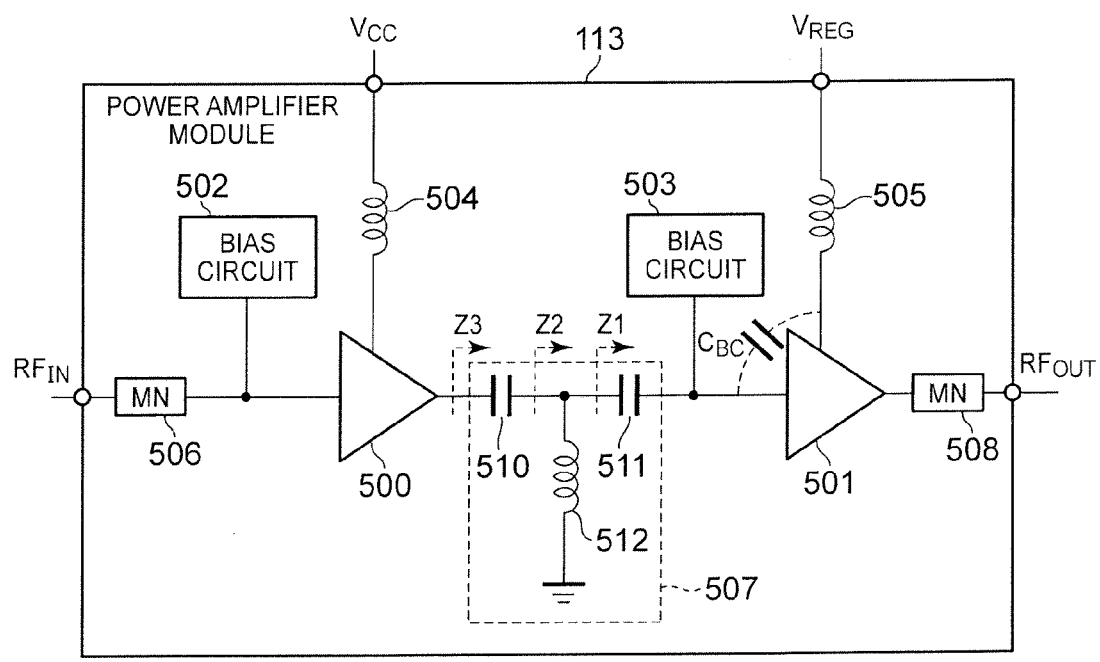
FIG. 5 is a diagram illustrating a configuration example of a power amplifier module.

FIG. 5 is a diagram illustrating a configuration example of the power amplifier module 113. As illustrated in FIG. 5, the power amplifier module 113 includes a power amplifier circuit 500 (first power amplifier circuit), a power amplifier circuit 501 (second power amplifier circuit), bias circuits 502 and 503, inductors 504 and 505, and matching circuits 506, 507, and 508.

The power amplifier circuits 500 and 501 constitute a two-stage amplifier circuit, amplify an input RF signal ($RF_{IN}$), and output an amplified signal ($RF_{OUT}$). Each amplifier circuit includes a bipolar transistor (for example, a hetero-junction bipolar transistor) and amplifies and outputs an input signal. The power amplifier circuit 500 is supplied with a source voltage $V_{CC}$ (for example, a battery voltage) of a predetermined level via the inductor 504. On the other hand, the power amplifier circuit 501 is supplied with a source voltage $V_{REG}$ controlled to the level corresponding to the amplitude level of the RF signal ($RF_{IN}$) via the inductor 505.

The bias circuits 502 and 503 supply a bias to the power amplifier circuits 500 and 501.

The matching circuits 506 to 508 are provided to match impedance between stages. The matching circuit 507 is disposed between the power amplifier circuits 500 and 501 and includes a capacitor 510 (first capacitor), a capacitor 511 (second capacitor), and an inductor 512 (inductor). Specifically, the capacitors 510 and 511 are connected in series between the power amplifier circuits 500 and 501, and the inductor 512 is connected between a node between the capacitors 510 and 511 and the ground.

In the power amplifier module 113, a base-collector parasitic capacitance $C_{BC}$ of the bipolar transistor which is an amplifier element constituting the power amplifier circuit 501 decreases as the source voltage $V_{REG}$ to be supplied to the power amplifier circuit 501 increases, and thus the gain of the power amplifier circuit 501 increases. Accordingly, in the power amplifier module 113, the gain of the power amplifier circuit 500 is made to decrease by the matching circuit 507 as the source voltage $V_{REG}$ increases. Accordingly, the variation in the gain due to the variation in the source voltage $V_{REG}$ is suppressed in the entire power amplifier module 113. This point will be described below.

Figure 6:
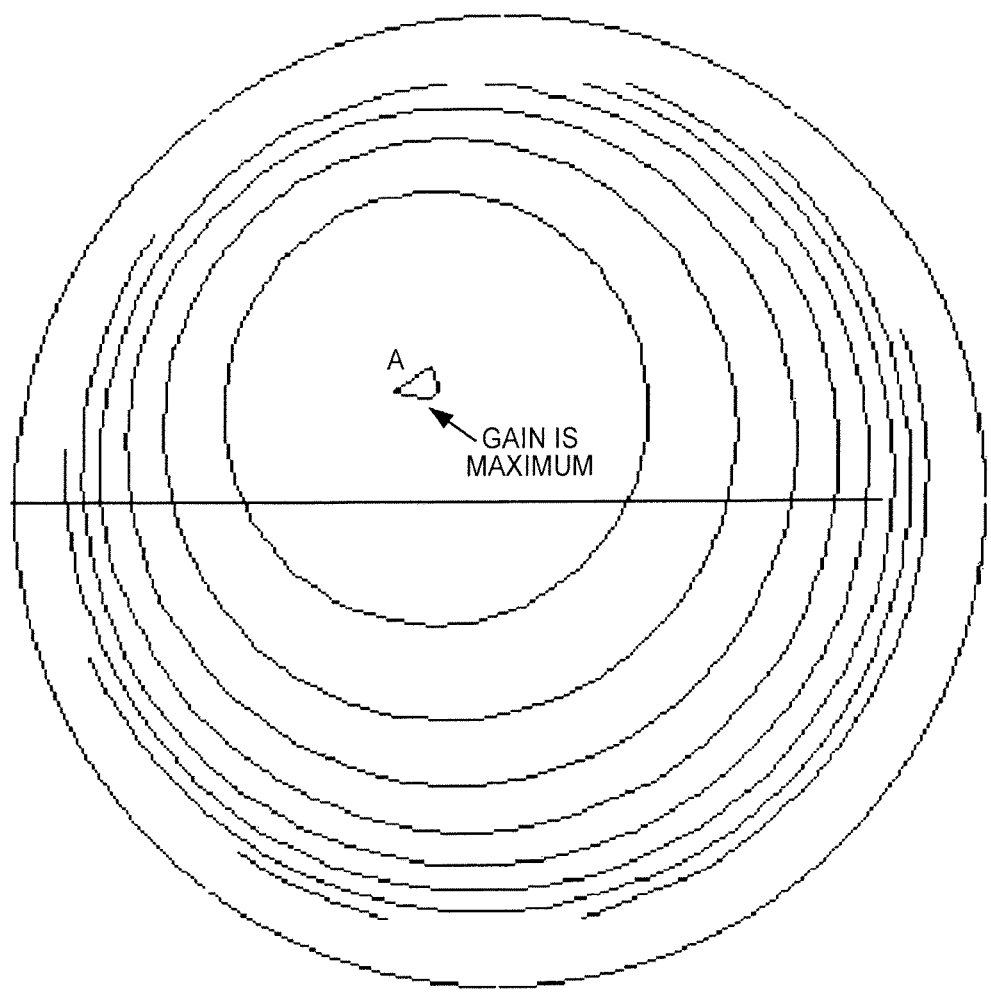
FIG. 6 is a diagram illustrating an example of a load pull of the power amplifier circuit.
Figure 7:
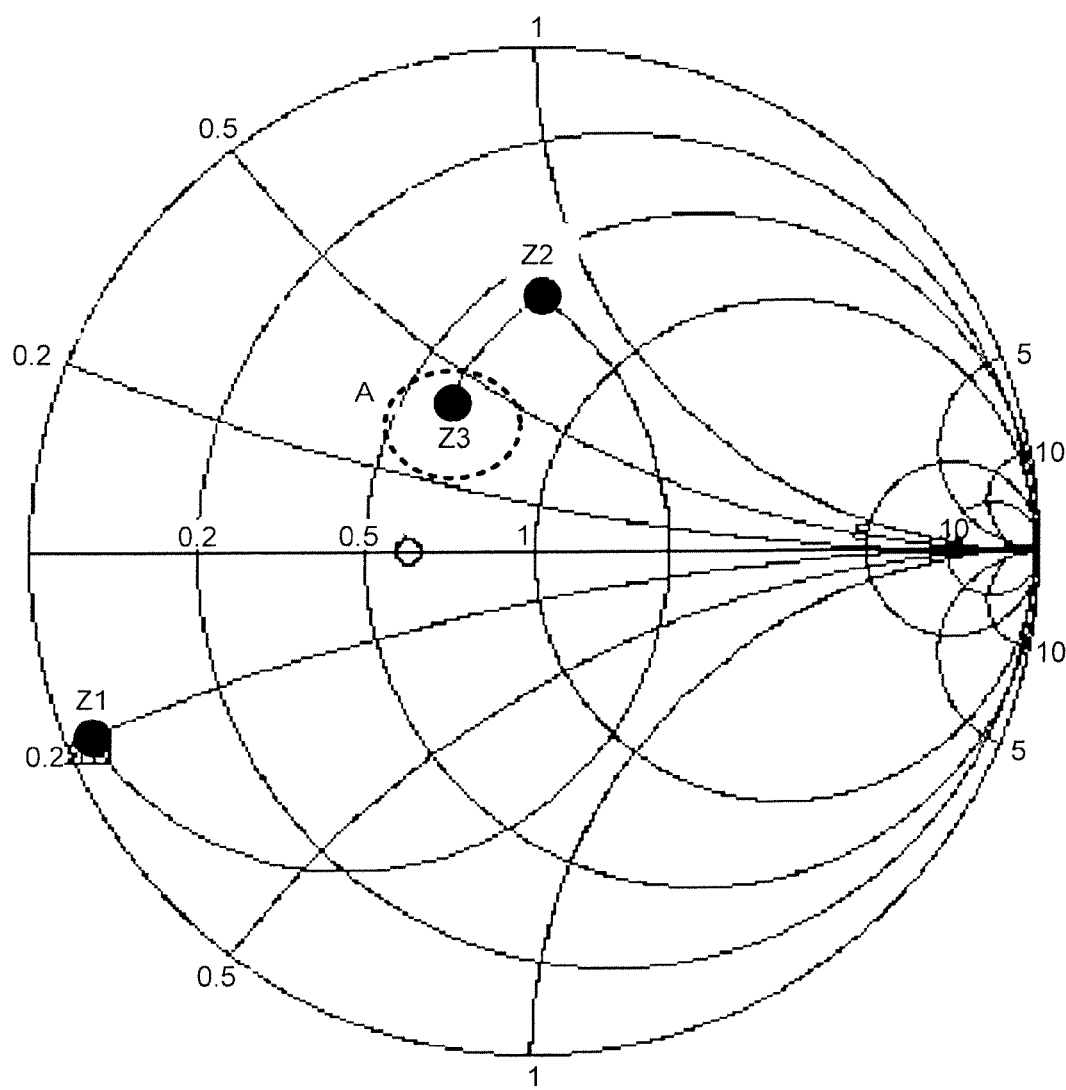
FIG. 7 is a diagram illustrating an example of load impedance Z3 when a source voltage $V_{REG}$ has a relatively low level.
Figure 8:
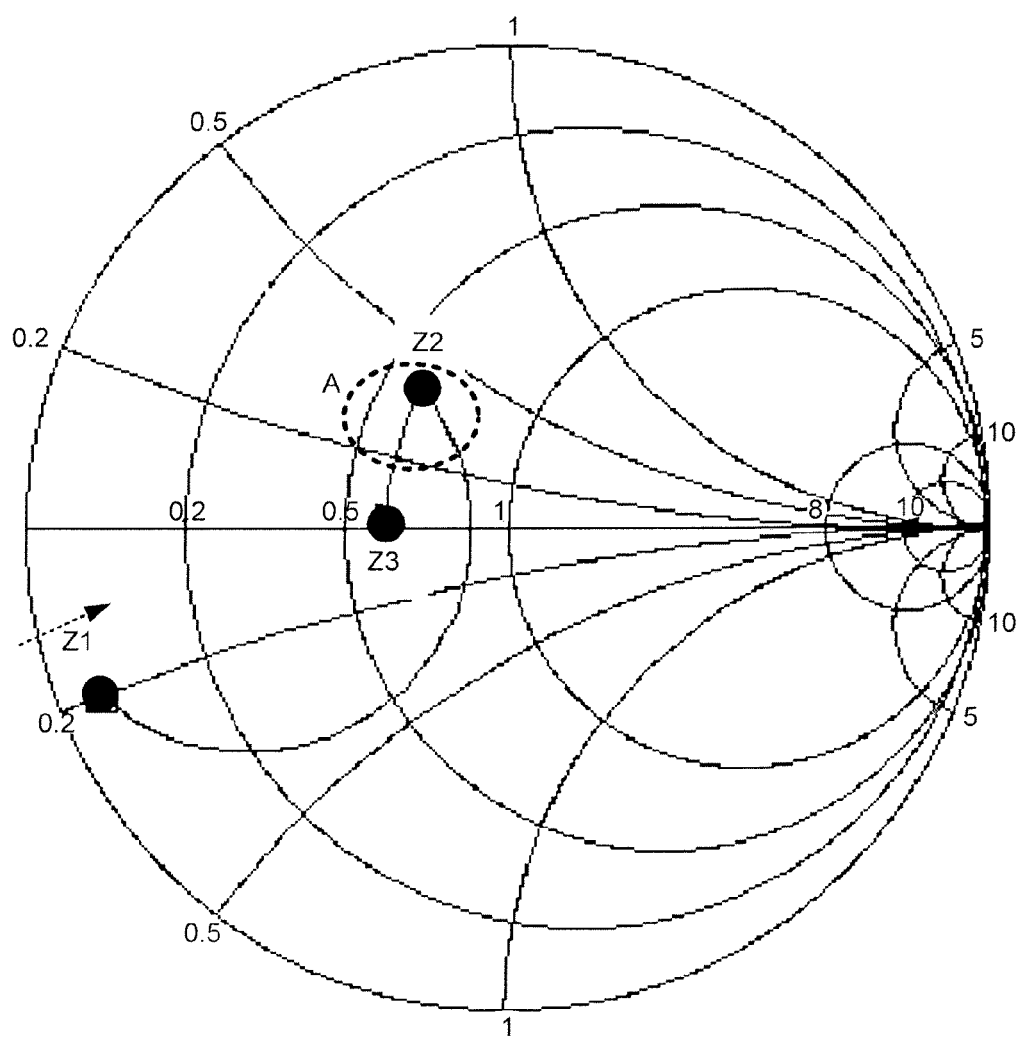
FIG. 8 is a diagram illustrating an example of load impedance Z3 when the source voltage $V_{REG}$ has a relatively high level.

FIG. 6 is a diagram illustrating an example of a load pull of the power amplifier circuit 500. In the example illustrated in FIG. 6, the vicinity of point A on the upper-left side from the center is a region in which the gain of the power amplifier circuit 500 is the maximum. FIGS. 7 and 8 are Smith charts illustrating an example of output-side impedance (load impedance) Z3 of the power amplifier circuit 500.

FIG. 7 illustrates an example of load impedance Z3 when the source voltage $V_{REG}$ has a relatively low level (for example, about 0.8 V). As illustrated in FIG. 7, the load impedance Z3 is located in the vicinity of point A which is a region in which the gain of the power amplifier circuit 500 is the maximum.

FIG. 8 illustrates an example of load impedance Z3 when the source voltage $V_{REG}$ has a relatively high level (for example, about 3.4 V). As illustrated in FIG. 8, the load impedance Z3 is located at a position separated from point A which is a region in which the gain of the power amplifier circuit 500 is the maximum. This is because as the source voltage $V_{REG}$ increases, the parasitic capacitance $C_{BC}$ in the power amplifier circuit 501 decreases and the input-side impedance Z1 of the capacitor 511 is shifted in the direction of an arrow illustrated in FIG. 8. Accordingly, the gain of the power amplifier circuit 500 decreases.

Figure 9:
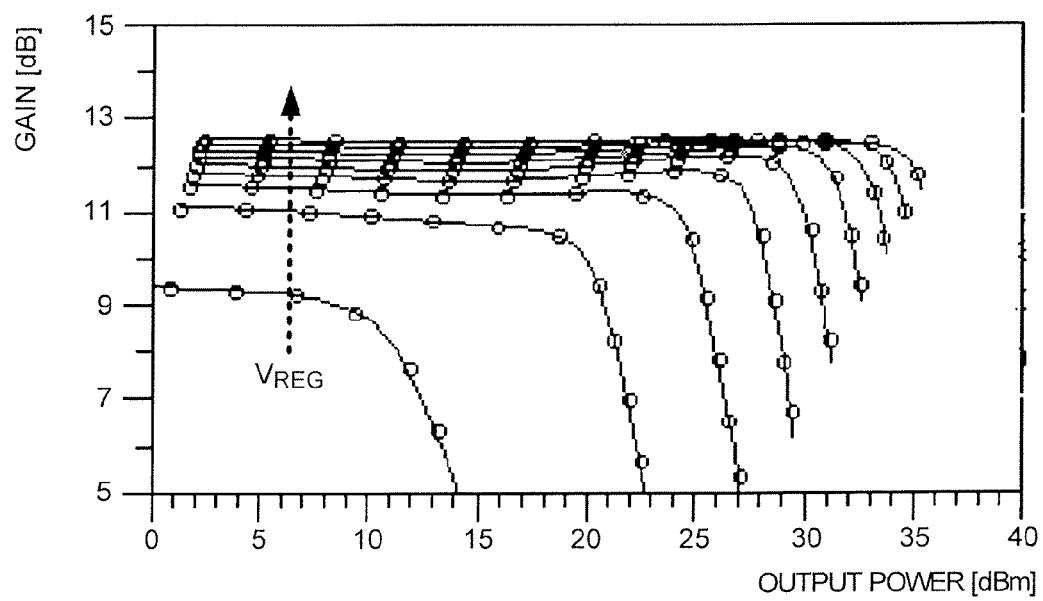
FIG. 9 is a diagram illustrating an example of gain characteristics in a second-stage power amplifier circuit.
Figure 10:
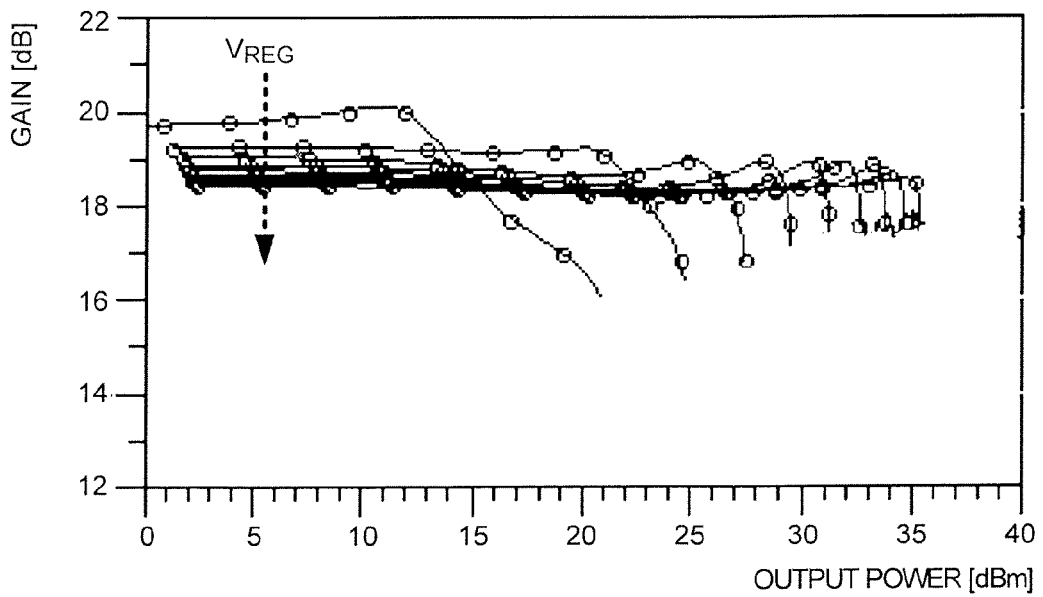
FIG. 10 is a diagram illustrating an example of gain characteristics in a first-stage power amplifier circuit.

FIGS. 9 and 10 are graphs illustrating an example of a relationship between the source voltage $V_{REG}$ and the gain in the power amplifier module 113. FIG. 9 illustrates an example of the gain characteristics in the second-stage power amplifier circuit 501. As described above, in the power amplifier circuit 501, since the base-collector parasitic capacitance $C_{BC}$ decreases as the source voltage $V_{REG}$ increases, the gain also increases. FIG. 10 illustrates an example of the gain characteristics in the first-stage power amplifier circuit 500. In the first-stage power amplifier circuit 500, the gain decreases as the source voltage $V_{REG}$ increases, on the contrary to the second-stage power amplifier circuit 501. This is because the load impedance Z3 of the power amplifier circuit 500 varies as illustrated in FIGS. 7 and 8.

Accordingly, the increase of the gain of the power amplifier circuit 501 due to the increase in the source voltage $V_{REG}$ is cancelled with the decrease of the gain of the power amplifier circuit 500, and the variation in the gain due to the variation in the source voltage $V_{REG}$ is suppressed in the entire power amplifier module 113. That is, it is possible to improve linearity of the power amplifier module 113 without performing complex control of controlling the source voltage $V_{CC}$ of the first-stage power amplifier circuit 500 in addition to the envelope tracking control.

In the matching circuit 507 of the power amplifier module 113, the capacitance value of the capacitor 511 can be set to be larger than the capacitance value of the capacitor 510 (for example, by about two to three times). In this way, by setting the capacitance value of the capacitor 511 to be larger, it is possible to reduce the influence of the variation in the base-collector parasitic capacitance $C_{BC}$ of the power amplifier circuit 501. Accordingly, it is possible to improve linearity in the power amplifier module 113.

Figure 11:
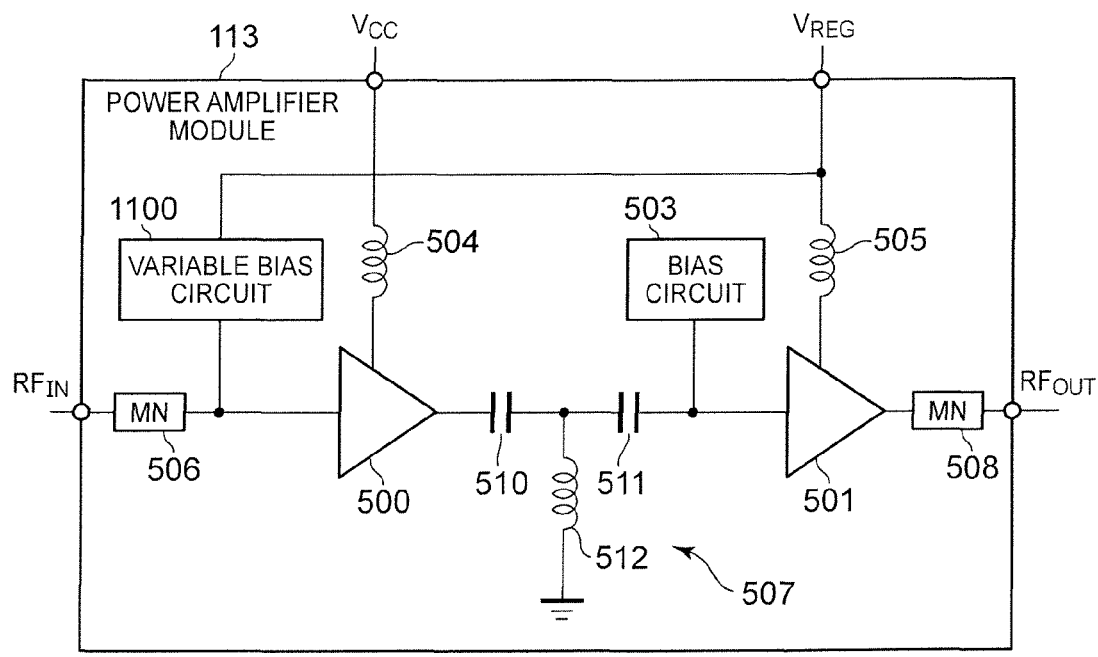
FIG. 11 is a diagram illustrating another configuration example of the power amplifier module.

FIG. 11 is a diagram illustrating another configuration example of the power amplifier module 113. The same elements as illustrated in FIG. 5 will be referenced by the same reference signs and description thereof will not be repeated. As illustrated in FIG. 11, the power amplifier module 113 includes a variable bias circuit 1100 instead of the bias circuit 502 illustrated in FIG. 5.

The variable bias circuit 1100 supplies the power amplifier circuit 500 with a bias which decreases as the source voltage $V_{REG}$ to be supplied to the power amplifier circuit 501 increases. As described above, as the source voltage $V_{REG}$ increases, the base-collector parasitic capacitance $C_{BC}$ of the power amplifier circuit 501 decreases and thus the gain of the power amplifier circuit 501 increases.

In the power amplifier module 113, similarly to the configuration illustrated in FIG. 5, the gain of the power amplifier circuit 500 is controlled by the matching circuit 507 including the capacitors 510 and 511 and the inductor 512 so that the gain decreases as the source voltage $V_{REG}$ increases. In the power amplifier module 113, by causing the variable bias circuit 1100 to supply the power amplifier circuit 500 with a bias which decreases as the source voltage $V_{REG}$ increases, it is possible to enhance precision of gain adjustment of the power amplifier circuit 500. Accordingly, it is possible to suppress a variation in gain in the power amplifier module 113 as a whole and thus to improve linearity of the power amplifier module 113.

Figure 12:
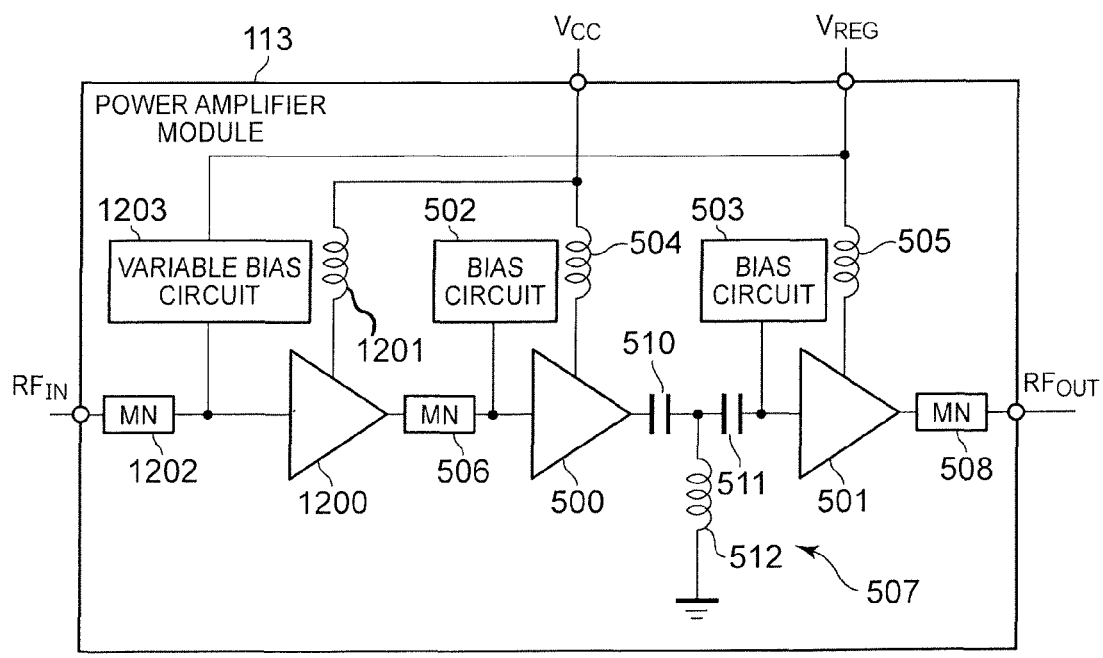
FIG. 12 is a diagram illustrating still another configuration example of the power amplifier module.

FIG. 12 is a diagram illustrating still another configuration example of the power amplifier module 113. The same elements as illustrated in FIG. 5 will be referenced by the same reference signs and description thereof will not be repeated. As illustrated in FIG. 12, the power amplifier module 113 includes a power amplifier circuit 1200 (third power amplifier circuit), an inductor 1201, a matching circuit 1202, and a variable bias circuit 1203 in addition to the elements illustrated in FIG. 5. That is, the power amplifier module 113 includes a three-stage power amplifier circuit.

The power amplifier circuit 1200 is a first-stage power amplifier circuit that amplifies the RF signal ($RF_{IN}$) on the basis of the source voltage $V_{CC}$ supplied via the inductor 1201. The power amplifier circuit 1200 amplifies and outputs the RF signal ($RF_{IN}$) input via the matching circuit 1202. The RF signal amplified by the power amplifier circuit 1200 is amplified by the power amplifier circuits 500 and 501 and is output as an amplified signal ($RF_{OUT}$), similarly to the configuration illustrated in FIG. 5.

The variable bias circuit 1203 supplies the power amplifier circuit 1200 with a bias which decreases as the source voltage $V_{REG}$ supplied to the power amplifier circuit 501 increases, similarly to the variable bias circuit 1100 illustrated in FIG. 11. In the power amplifier module 113, similarly to the configuration illustrated in FIG. 5, the gain of the power amplifier circuit 500 is controlled to decrease by the matching circuit 507 including the capacitors 510 and 511 and the inductor 512 as the source voltage $V_{REG}$ increases. In the power amplifier module 113, the variable bias circuit 1203 supplies the power amplifier circuit 1200 with a bias which decreases as the source voltage $V_{REG}$ increases, whereby the gain of the power amplifier circuit 1200 is adjusted.

In this way, in the power amplifier module 113 including a three-stage power amplifier circuit, it is possible to suppress a variation in gain in the power amplifier module 113 as a whole by adjusting the bias supplied to the first-stage power amplifier circuit 1200 depending on the source voltage $V_{REG}$ for the envelope tracking control.

Figure 13:
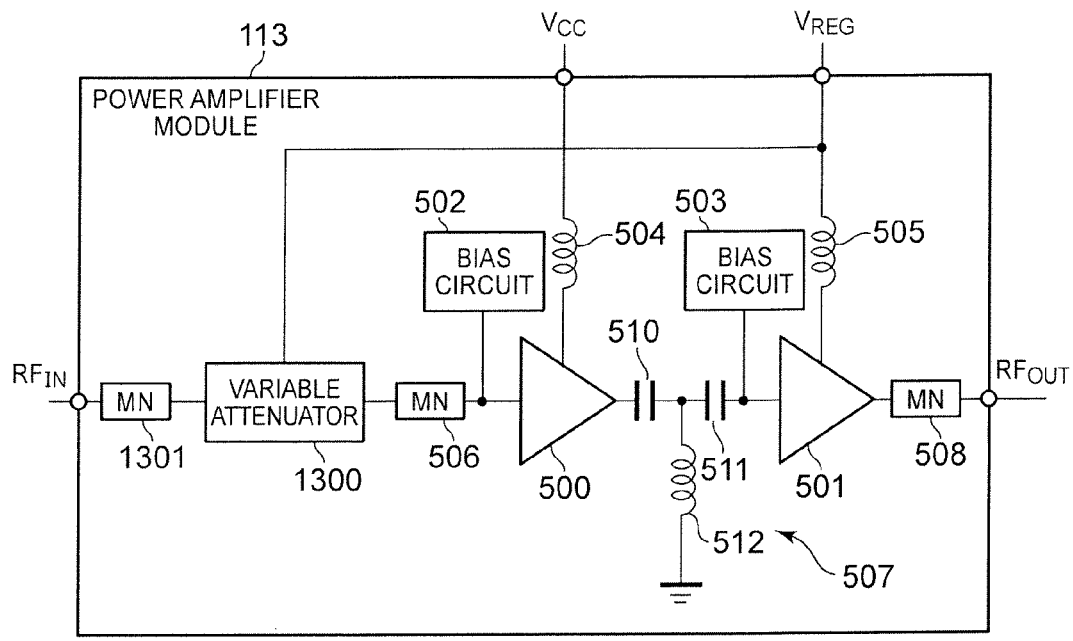
FIG. 13 is a diagram illustrating still another configuration example of the power amplifier module.

FIG. 13 is a diagram illustrating still another configuration example of the power amplifier module 113. The same elements as illustrated in FIG. 5 will be referenced by the same reference signs and description thereof will not be repeated. As illustrated in FIG. 13, the power amplifier module 113 includes a variable attenuator 1300 and a matching circuit 1301 in addition to the elements illustrated in FIG. 5.

The variable attenuator 1300 attenuates the RF signal ($RF_{IN}$) input via the matching circuit 1301 and outputs the attenuated RF signal. The attenuation rate of the variable attenuator 1300 varies depending on the source voltage $V_{REG}$ supplied to the power amplifier circuit 501. Specifically, the attenuation rate of the variable attenuator 1300 increases as the source voltage $V_{REG}$ increases. In the power amplifier module 113, similarly to the configuration illustrated in FIG. 5, the gain of the power amplifier circuit 500 is controlled to decrease as the source voltage $V_{REG}$ increases by the matching circuit 507 including the capacitors 510 and 511 and the inductor 512. In the power amplifier module 113, the variable attenuator 1300 increases the attenuation rate of the RF signal ($RF_{IN}$) as the source voltage $V_{REG}$ increases. Accordingly, the gain of the power amplifier circuit 501 increasing with the increase in the source voltage $V_{REG}$ is cancelled by the decrease in gain of the power amplifier circuit 500 and the increase in attenuation rate of the variable attenuator 1300, whereby it is possible to suppress a variation in gain in the power amplifier module 113 as a whole.

Figure 14:
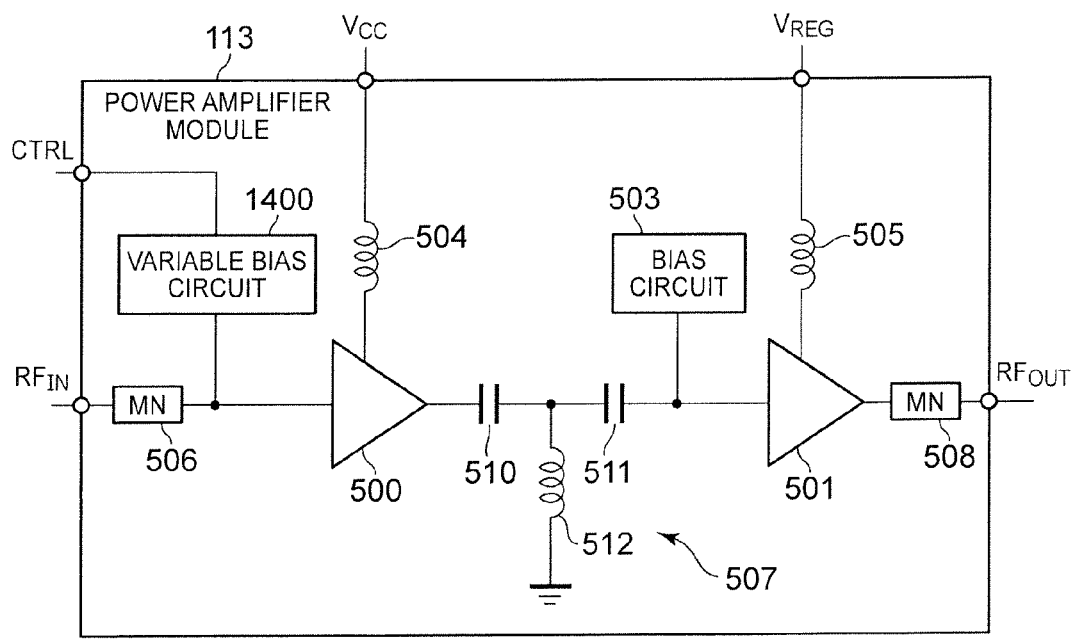
FIG. 14 is a diagram illustrating still another configuration example of the power amplifier module.

FIG. 14 is a diagram illustrating still another configuration example of the power amplifier module 113. The same elements as illustrated in FIG. 11 will be referenced by the same reference signs and description thereof will not be repeated. As illustrated in FIG. 14, the power amplifier module 113 includes a variable bias circuit 1400 instead of the variable bias circuit 1100 illustrated in FIG. 11. The variable bias circuit 1400 supplies the power amplifier circuit 500 with a bias which varies depending on a control signal CTRL for adjusting the source voltage $V_{REG}$. Specifically, the variable bias circuit 1400 supplies the power amplifier circuit 500 with a bias which decreases as the amplitude level of the RF signal ($RF_{IN}$) increases.

In the power amplifier module 113, similarly to the configuration illustrated in FIG. 11, the gain of the power amplifier circuit 500 is controlled to decrease as the source voltage $V_{REG}$ increases by the matching circuit 507 including the capacitors 510 and 511 and the inductor 512. Since the source voltage $D_{REG}$ supplied to the power amplifier circuit 501 of the power amplifier module 113 increases as the amplitude level of the RF signal ($RF_{IN}$) increases, the gain of the power amplifier circuit 500 is adjusted to decrease as the amplitude level of the RF signal ($RF_{IN}$) increases. In the power amplifier module 113, since the variable bias circuit 1400 supplies the power amplifier circuit 500 with the bias which decreases as the amplitude level of the RF signal ($RF_{IN}$) increases, it is possible to improve adjustment precision of the gain of the power amplifier circuit 500. Accordingly, it is possible to suppress a variation in gain in the power amplifier module 113 as a whole and to improve linearity of the power amplifier module 113.

Figure 15:
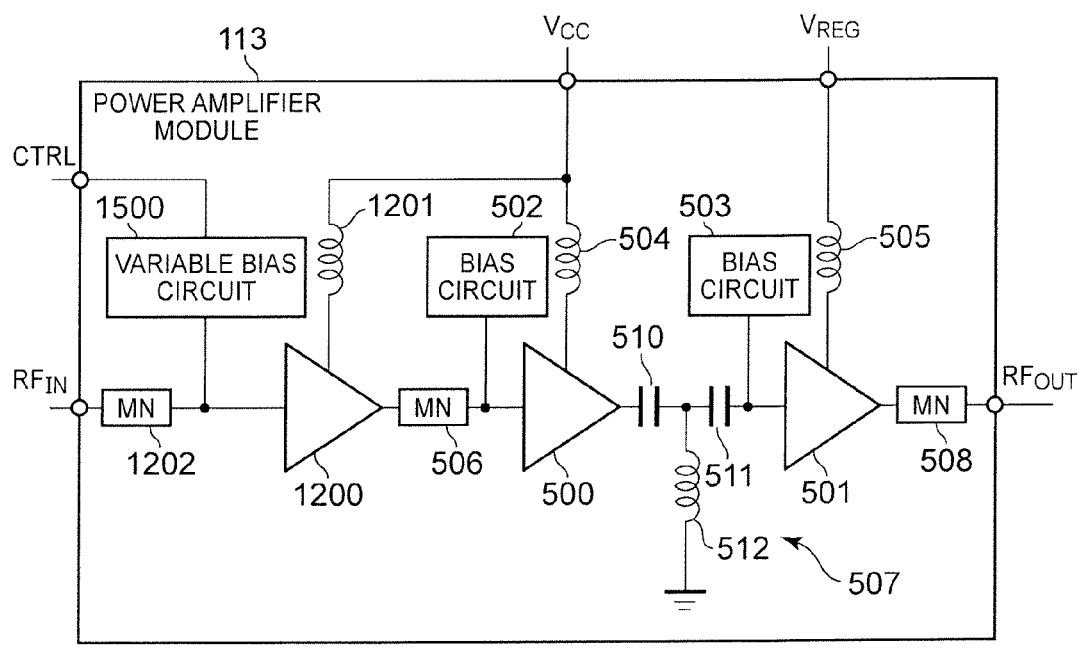
FIG. 15 is a diagram illustrating still another configuration example of the power amplifier module.

FIG. 15 is a diagram illustrating still another configuration example of the power amplifier module 113. The same elements as illustrated in FIG. 12 will be referenced by the same reference signs and description thereof will not be repeated. As illustrated in FIG. 15, the power amplifier module 113 includes a variable bias circuit 1500 instead of the variable bias circuit 1203 illustrated in FIG. 12.

The variable bias circuit 1500 supplies the power amplifier circuit 1200 with a bias which varies depending on a control signal CTRL for adjusting the source voltage $V_{REG}$. Specifically, the variable bias circuit 1500 supplies the power amplifier circuit 1200 with a bias which decreases as the amplitude level of the RF signal ($RF_{IN}$) increases.

In the power amplifier module 113, similarly to the configuration illustrated in FIG. 12, the gain of the power amplifier circuit 500 is controlled to decrease as the source voltage $V_{REG}$ increases by the matching circuit 507 including the capacitors 510 and 511 and the inductor 512. Since the source voltage $V_{REG}$ supplied to the power amplifier circuit 501 of the power amplifier module 113 increases as the amplitude level of the RF signal ($RF_{IN}$) increases, the gain of the power amplifier circuit 500 is adjusted to decrease as the amplitude level of the RF signal ($RF_{IN}$) increases. In the power amplifier module 113, the variable bias circuit 1500 supplies the power amplifier circuit 1200 with the bias which decreases as the amplitude level of the RF signal ($RF_{IN}$) increases, whereby the gain of the power amplifier circuit 1200 is adjusted. Accordingly, it is possible to suppress a variation in gain in the power amplifier module 113 as a whole and to improve linearity of the power amplifier module 113.

Figure 16:
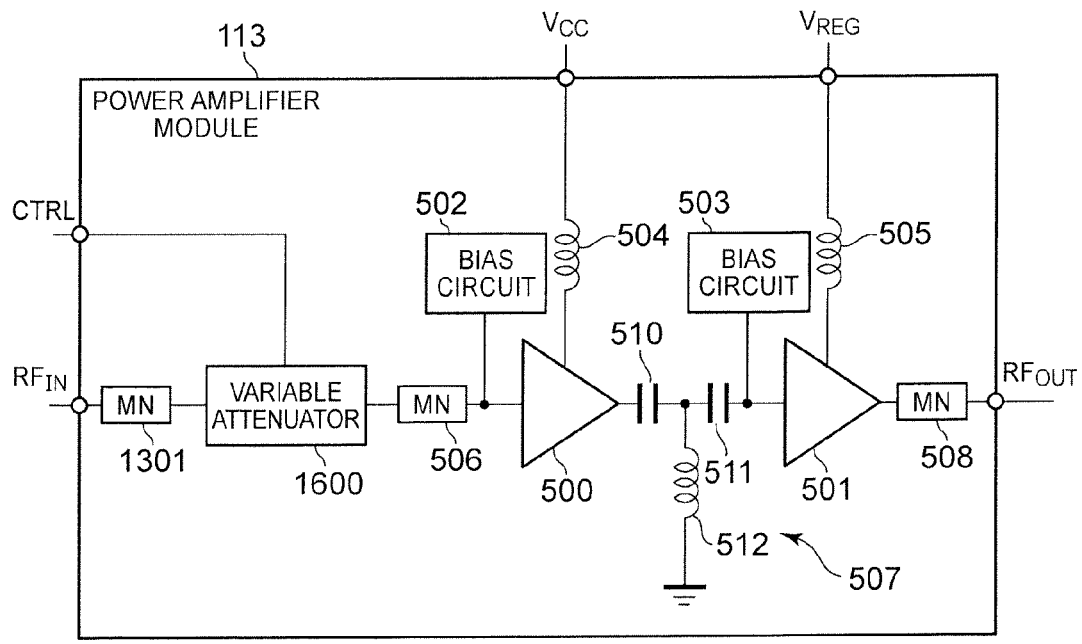
FIG. 16 is a diagram illustrating still another configuration example of the power amplifier module.

FIG. 16 is a diagram illustrating still another configuration example of the power amplifier module 113. The same elements as illustrated in FIG. 13 will be referenced by the same reference signs and description thereof will not be repeated. As illustrated in FIG. 16, the power amplifier module 113 includes a variable attenuator 1600 instead of the variable attenuator 1300 illustrated in FIG. 13.

The variable attenuator 1600 attenuates the RF signal ($RF_{IN}$) input via the matching circuit 1301 and outputs the attenuated RF signal. The attenuation rate of the variable attenuator 1600 varies depending on the control signal CTRL for adjusting the source voltage $V_{REG}$. Specifically, the attenuation rate of the variable attenuator 1600 increases as the amplitude level of the RF signal ($RF_{IN}$) increases.

In the power amplifier module 113, similarly to the configuration illustrated in FIG. 13, the gain of the power amplifier circuit 500 is controlled to decrease as the source voltage $V_{REG}$ increases by the matching circuit 507 including the capacitors 510 and 511 and the inductor 512. Since the source voltage $V_{REG}$ supplied to the power amplifier circuit 501 of the power amplifier module 113 increases as the amplitude level of the RF signal ($RF_{IN}$) increases, the gain of the power amplifier circuit 500 is adjusted to decrease as the amplitude level of the RF signal ($RF_{IN}$) increases. In the power amplifier module 113, the variable attenuator 1600 attenuates the RF signal ($RF_{IN}$) with the attenuation rate which increases as the amplitude level of the RF signal ($RF_{IN}$) increases. Accordingly, it is possible to suppress a variation in gain in the power amplifier module 113 as a whole and to improve linearity of the power amplifier module 113.

Figure 17:
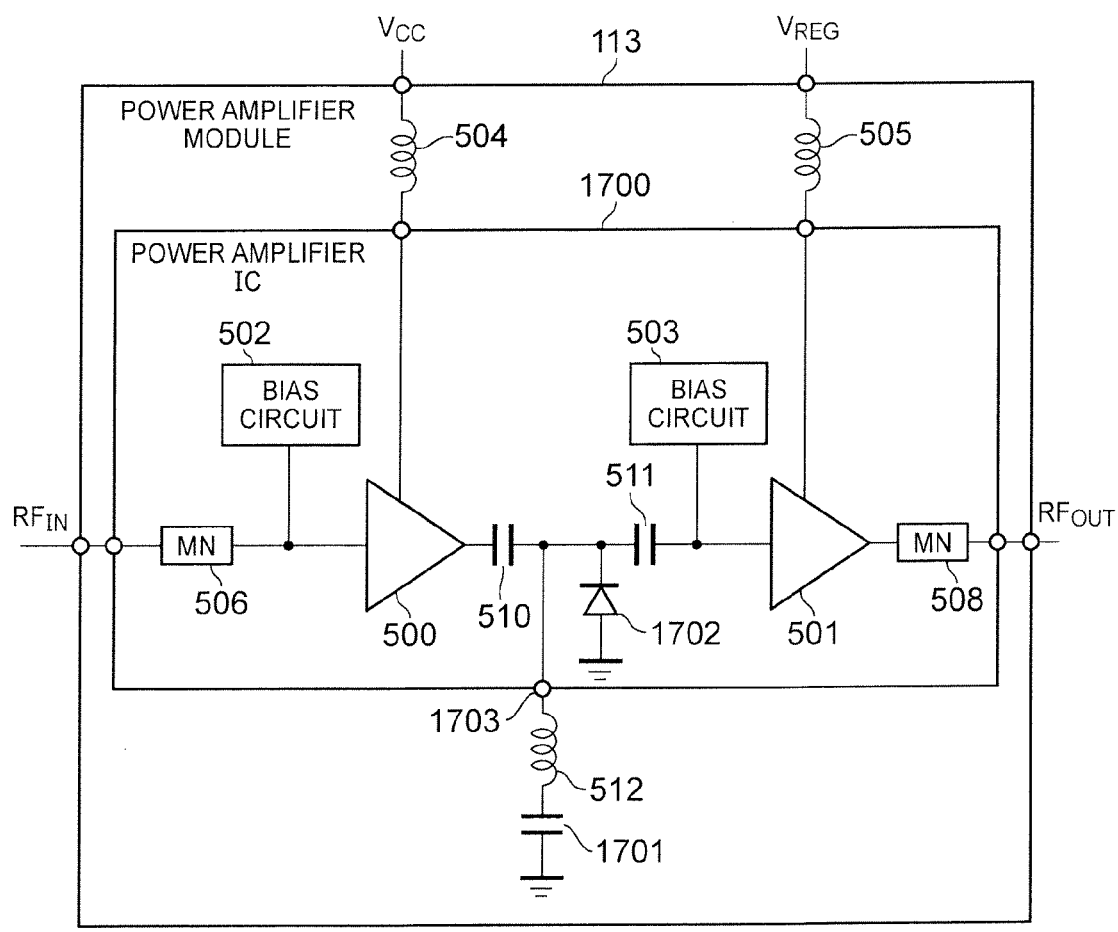
FIG. 17 is a diagram illustrating still another configuration example of the power amplifier module.

FIG. 17 is a diagram illustrating still another configuration example of the power amplifier module 113. The same elements as illustrated in FIG. 5 will be referenced by the same reference signs and description thereof will not be repeated. As illustrated in FIG. 17, the power amplifier module 113 includes a power amplifier integrated circuit (IC) 1700, inductors 504, 505, and 512, and a capacitor 1701 (third capacitor).

The power amplifier IC 1700 includes power amplifier circuits 500 and 501, bias circuits 502 and 503, matching circuits 506 and 508, capacitors 510 and 511, and a protection diode 1702.

The power amplifier IC 1700 is provided with a terminal 1703 for connection to the inductor 512. The inductor 512 is connected between the capacitors 510 and 511 via the terminal 1703. The capacitor 1701 is connected in series to the inductor 512.

The cathode of the protection diode 1702 is connected between the capacitors 510 and 511 and the anode thereof is grounded. The protection diode 1702 is provided to prevent destruction of circuits due to static electricity. That is, when static electricity intrudes from the terminal 1703, a current flows in the protection diode 1702 to absorb the static electricity and thus it is possible to prevent a high voltage from being applied to circuits in the power amplifier IC 1700.

Since the voltage (the voltage of the cathode of the protection diode 1702) of the RF signal output from the capacitor 511 may have a negative value, there is a possibility that a forward current will flow in the protection diode 1702. When such a current flows, energy loss occurs and the output of the power amplifier module 113 may be deteriorated. In order to prevent a forward current from flowing in the protection diode 1702, it may be considered that plural protection diodes 1702 are connected in series. However, in this case, the protection resistance to static electricity is deteriorated.

Therefore, in the power amplifier module 113 illustrated in FIG. 17, the capacitor 1701 is connected in series to the inductor connected to the terminal 1703. The voltage of the cathode of the protection diode 1702 increases by the capacitor 1701 and it is thus possible to prevent a forward current from flowing in the protection diode 1702.

In the power amplifier module 113, the capacitor 1701 has a capacitance value larger than those of the capacitors 510 and 511. For example, the capacitance values of the capacitors 510 and 511 are several pF, but the capacitance value of the capacitor 1701 can be set to about 100 pF. In this way, by setting the capacitance value of the capacitor 1701 to be large, the resonance frequency is shifted to a lower side and it is thus possible to suppress an influence to the RF signal.

Figure 18:
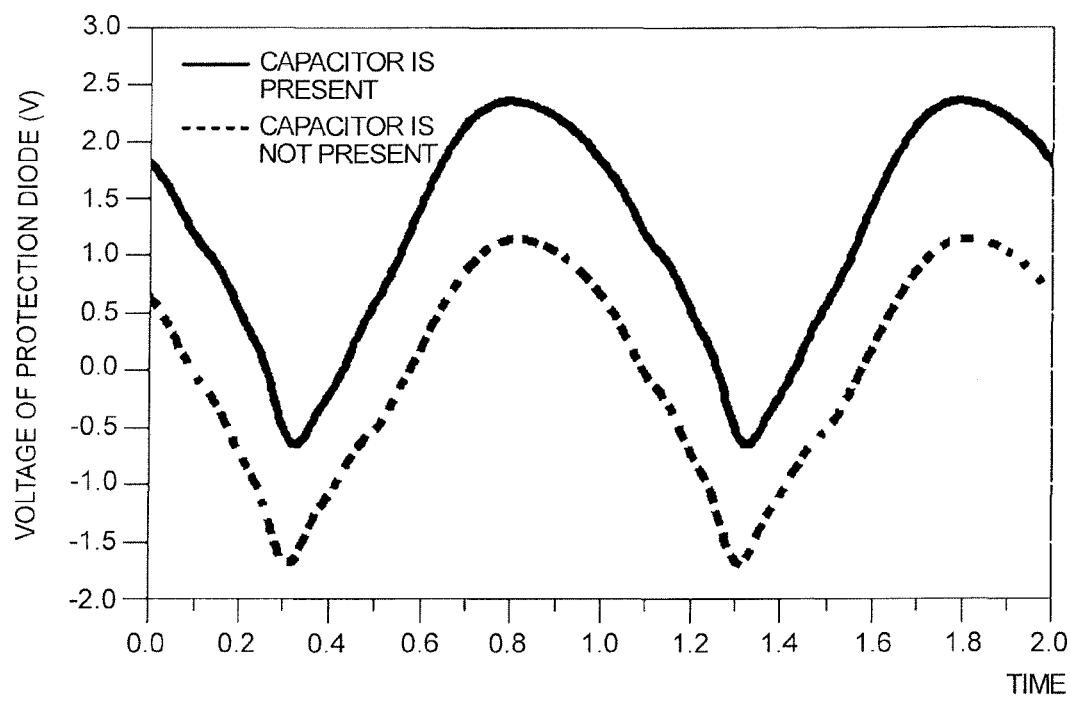
FIG. 18 is a diagram illustrating an example of a cathode voltage of a protection diode.

FIG. 18 is a diagram illustrating an example of the voltage of the cathode of the protection diode 1702. In FIG. 18, a voltage (solid line) when the capacitor 1701 is present and a voltage (dotted line) when the capacitor 1701 is not present are illustrated. As illustrated in FIG. 18, when the capacitor 1701 is present, the voltage of the cathode of the protection diode 1702 is higher than that in the case where the capacitor 1701 is not present.

Figure 19:
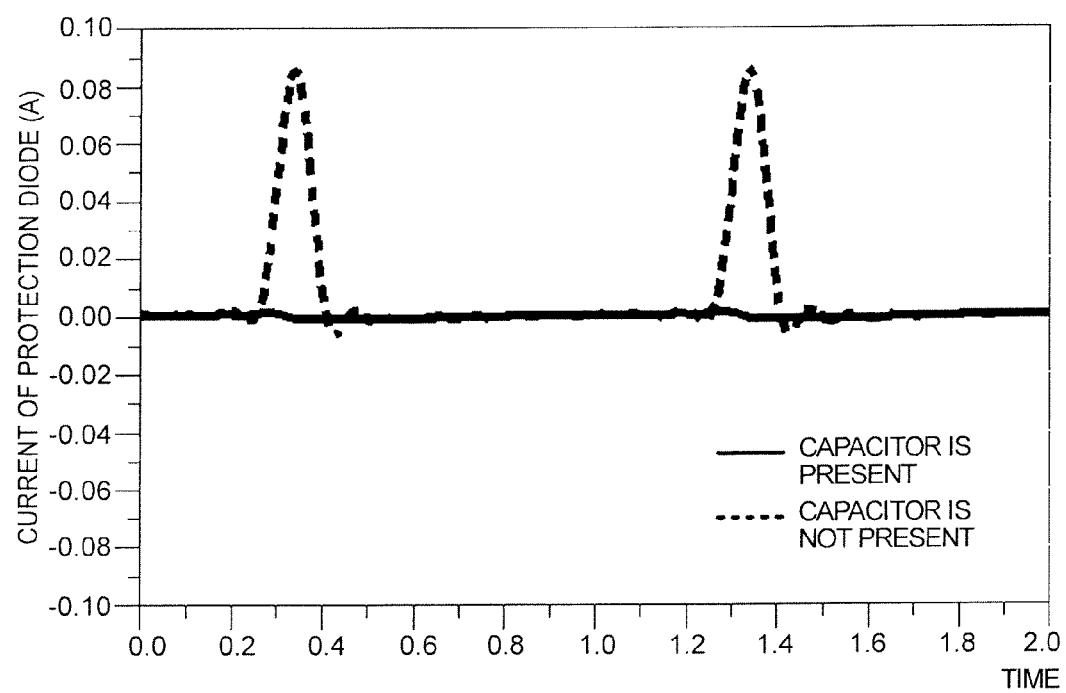
FIG. 19 is a diagram illustrating an example of a forward current flowing in the protection diode.

FIG. 19 is a diagram illustrating an example of a forward current flowing in the protection diode 1702. In FIG. 19, a current (solid line) when the capacitor 1701 is present and a current (dotted line) when the capacitor 1701 is not present are illustrated. As illustrated in FIG. 18, when the capacitor 1701 is present, the voltage of the cathode of the protection diode 1702 increases. Accordingly, as illustrated in FIG. 19, when the capacitor 1701 is present, a forward current is prevented from flowing in the protection diode 1702.

Figure 20:
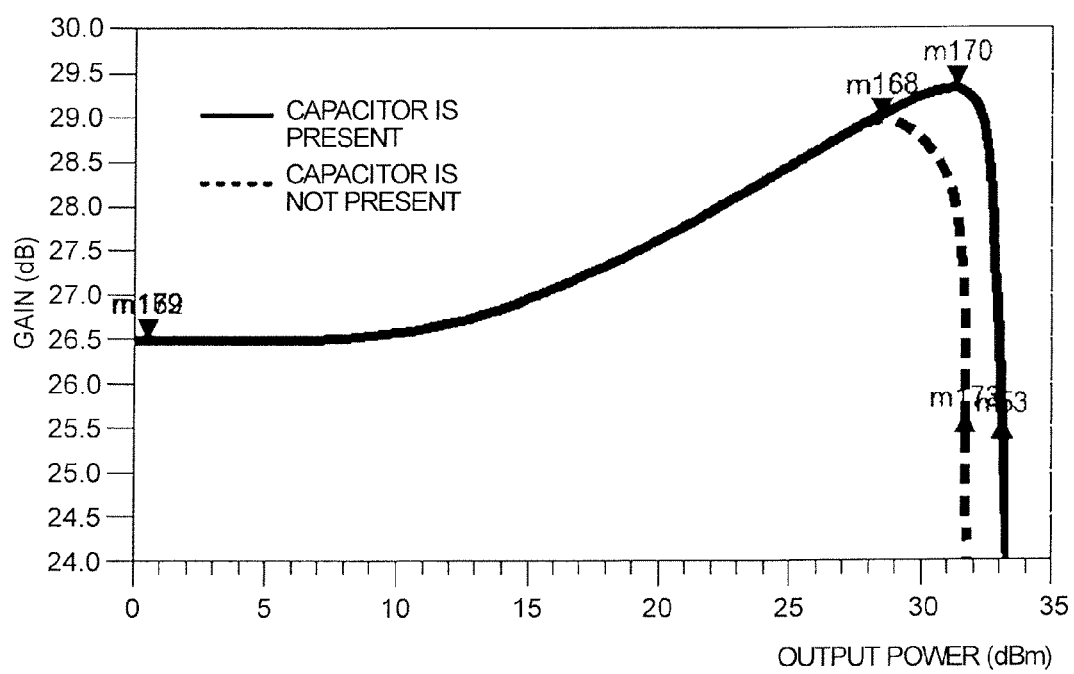
FIG. 20 is a diagram illustrating an example of a relationship between the output power and the gain in the power amplifier module.

FIG. 20 is a diagram illustrating an example of a relationship between the output power and the gain in the power amplifier module 113. In FIG. 20, an example (solid line) where the capacitor 1701 is present and an example (dotted line) where the capacitor 1701 is not present are illustrated. As illustrated in FIG. 20, when the capacitor 1701 is present, the maximum output power can be improved in comparison with the case where the capacitor 1701 is not present. This is because it is possible to suppress energy loss due to the forward current flowing in the protection diode 1702 thanks to presence of the capacitor 1701 as illustrated in FIG. 19.

Figure 21:
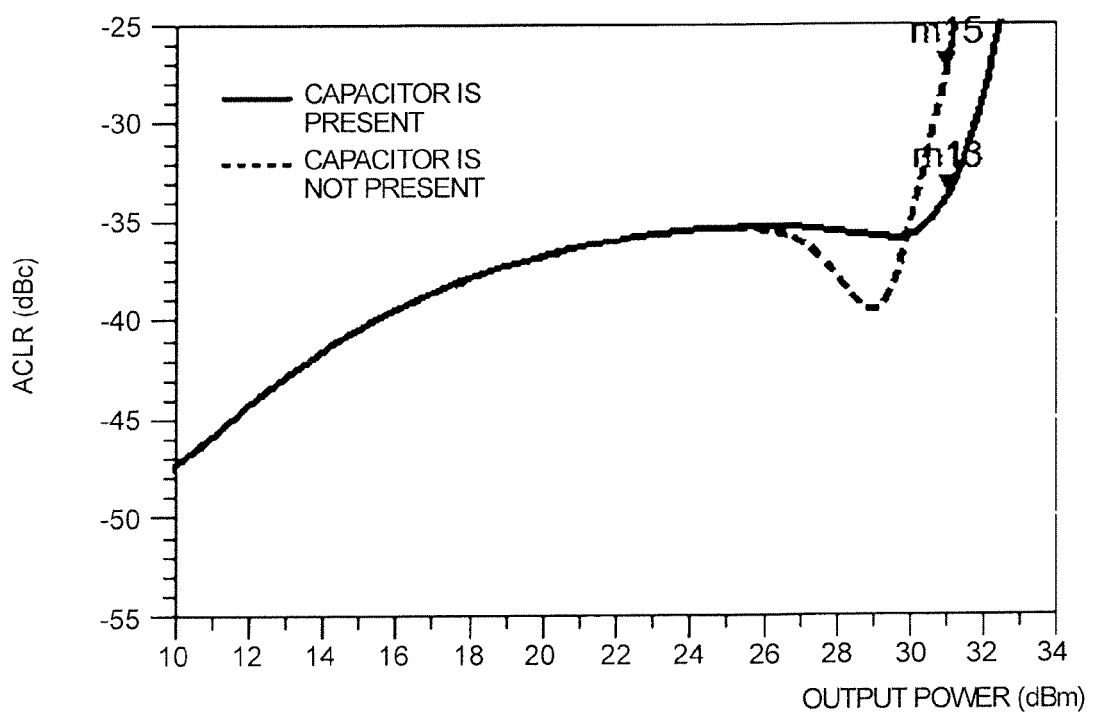
FIG. 21 is a diagram illustrating an example of a relationship between the output power and the adjacent channel leakage power ratio in the power amplifier module.

FIG. 21 is a diagram illustrating an example of a relationship between the output power and an adjacent channel leakage power ratio (ACLR) in the power amplifier module 113. In FIG. 21, an example (solid line) where the capacitor 1701 is present and an example (dotted line) where the capacitor 1701 is not present are illustrated. As illustrated in FIG. 21, when the capacitor 1701 is present, the distortion at the time of a high output operation can be reduced in comparison with the case where the capacitor 1701 is not present. This is because it is possible to suppress the distortion resulting from the forward current flowing in the protection diode 1702 thanks to presence of the capacitor 1701 as illustrated in FIG. 19.

Figure 22:
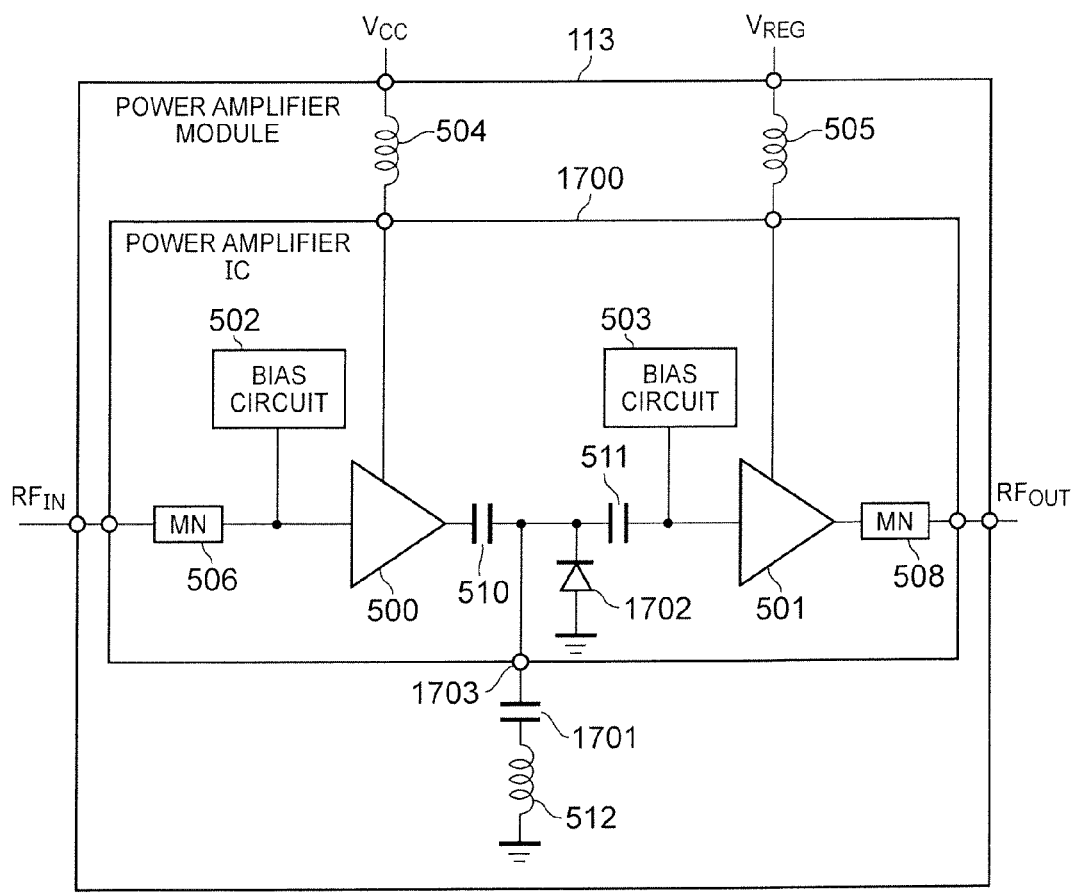
FIG. 22 is a diagram illustrating still another configuration example of the power amplifier module.

FIG. 22 is a diagram illustrating still another configuration example of the power amplifier module 113. The same elements as illustrated in FIG. 17 will be referenced by the same reference signs and description thereof will not be repeated. In the power amplifier module 113 illustrated in FIG. 22, the connection relationship of the inductor 512 and the capacitor 1701 is reversed in comparison with the configuration illustrated in FIG. 17. That is, the capacitor 1701 is connected to the terminal 1703 of the power amplifier IC 1700 and the inductor 512 is disposed between the capacitor 1701 and the ground. Even with this configuration, it is possible to achieve the same advantages as in the power amplifier module 113 illustrated in FIG. 17.

Figure 23:
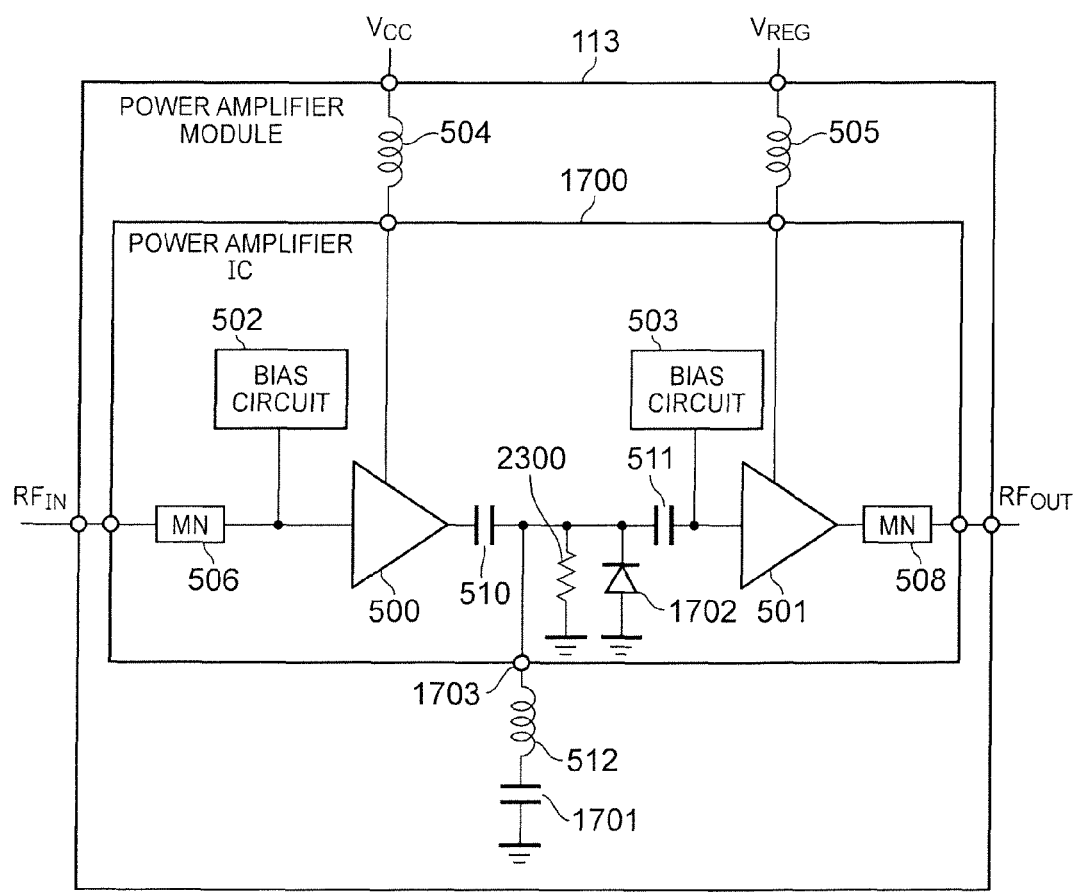
FIG. 23 is a diagram illustrating still another configuration example of the power amplifier module.

FIG. 23 is a diagram illustrating still another configuration example of the power amplifier module 113. The same elements as illustrated in FIG. 17 will be referenced by the same reference signs and description thereof will not be repeated. The power amplifier module 113 illustrated in FIG. 23 includes a resistor 2300 in the power amplifier IC 1700 in addition to the configuration illustrated in FIG. 17.

One end of the resistor 2300 is connected to a node between the capacitors 510 and 511 and the other end thereof is grounded. The resistor 2300 has a relatively large resistance value (for example, about 10 kΩ) in order to reduce the RF signal flowing in the resistor and to suppress an influence to the impedance of the inter-stage matching circuit due to connection of the resistor.

Figure 24:
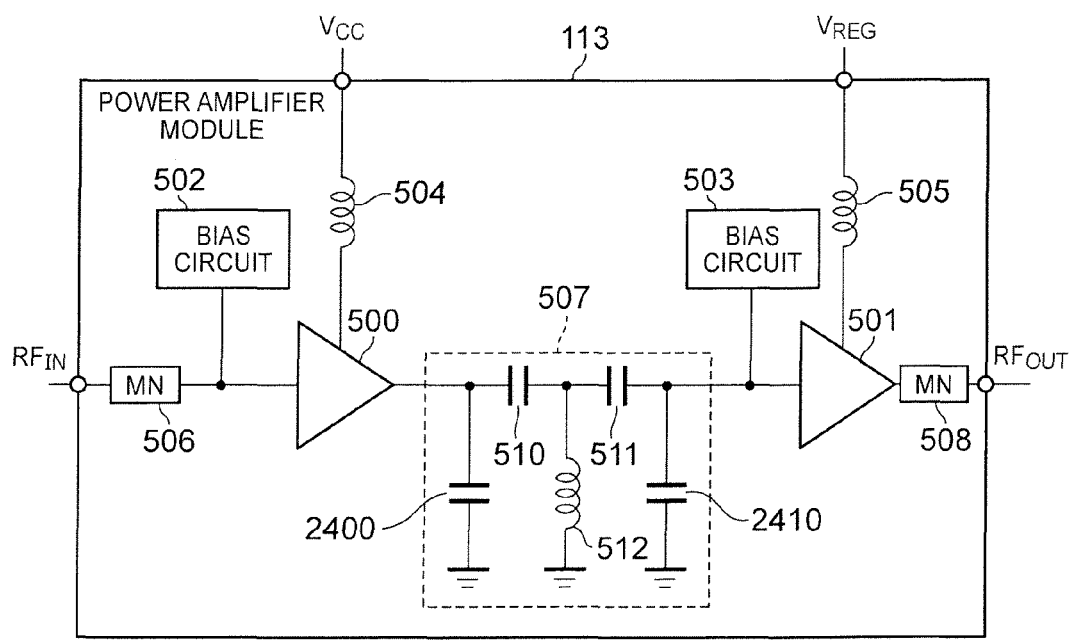
FIG. 24 is a diagram illustrating still another configuration example of the power amplifier module.

FIG. 24 is a diagram illustrating still another configuration example of the power amplifier module 113. The same elements as illustrated in FIG. 5 will be referenced by the same reference signs and description thereof will not be repeated. The power amplifier module 113 illustrated in FIG. 24 includes a capacitor 2400 (fourth capacitor) and a capacitor 2410 (fifth capacitor) in the matching circuit 507 in addition to the configuration illustrated in FIG. 5. Specifically, the capacitor 2400 is connected between a node between the power amplifier circuit 500 and the capacitor 510 and the ground. The capacitor 2410 is connected between a node between the capacitor 511 and the power amplifier circuit 501 and the ground.

In this way, by arranging the shunted capacitors 2400 and 2410 before and after the capacitors 510 and 511, it is possible to improve efficiency of the power amplifier module 113. This will be described below.

Figure 25:
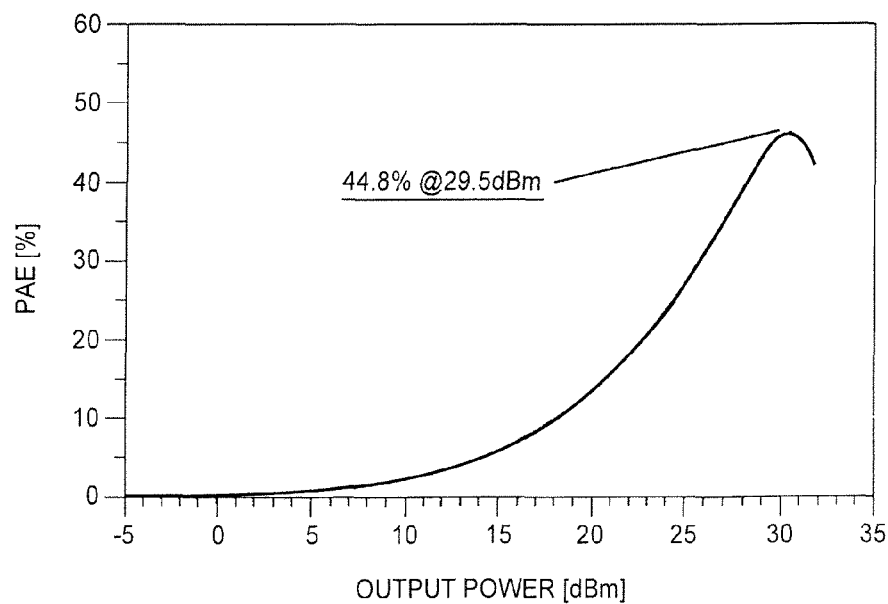
FIG. 25 is a diagram illustrating a simulation result of an example of efficiency of the power amplifier module illustrated in FIG. 5.

FIG. 25 is a diagram illustrating an example of a simulation result of efficiency of the power amplifier module 113 illustrated in FIG. 5. In FIG. 25, the horizontal axis represents the output power (dBm) and the vertical axis represents the power added efficiency (PAE) (%). In the simulation result illustrated in FIG. 25, the PAE of the power amplifier module 113 illustrated in FIG. 5 is 44.8% at output power of 29.5 dBm.

Figure 26:
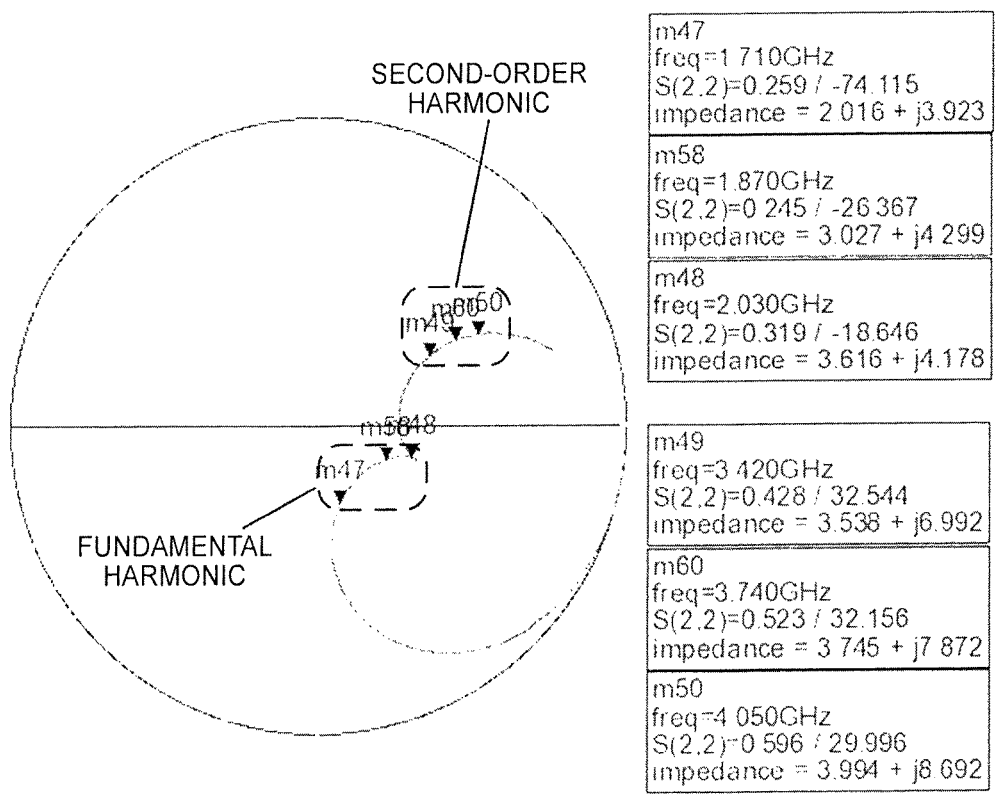
FIG. 26 is a Smith chart illustrating an example of frequency characteristics of output-side impedance of a matching circuit 507 of the power amplifier module illustrated in FIG. 5 in the simulation result illustrated in FIG. 25.

FIG. 26 is a Smith chart illustrating an example of frequency characteristics of output-side impedance of the matching circuit 507 of the power amplifier module 113 illustrated in FIG. 5 in the simulation result illustrated in FIG. 25. In the example illustrated in FIG. 26, three points of 1.710 GHz (m47), 1.870 GHz (m58), and 2.030 GHz (m48) are plotted as impedance of fundamental harmonics. In the example illustrated in FIG. 26, three points of 3.420 GHz (m49), 3.740 GHz (m60), and 4.050 GHz (m50) are plotted as impedance of second-order harmonics. The Smith chart illustrated in FIG. 26 is normalized with 2−j5 and the center thereof is 2+j5.

Here, as a simulation result of dependency of the PAE of the power amplifier circuit 501 on the impedance of second-order harmonics on the source side, the PAE is improved when the imaginary part is shifted to the vicinity of −j13. Accordingly, the impedance of second-order harmonics on the output side of the matching circuit 507 is adjusted so that the imaginary part is located in the vicinity of −j13. The review of the adjustment will be described below.

Figure 27:
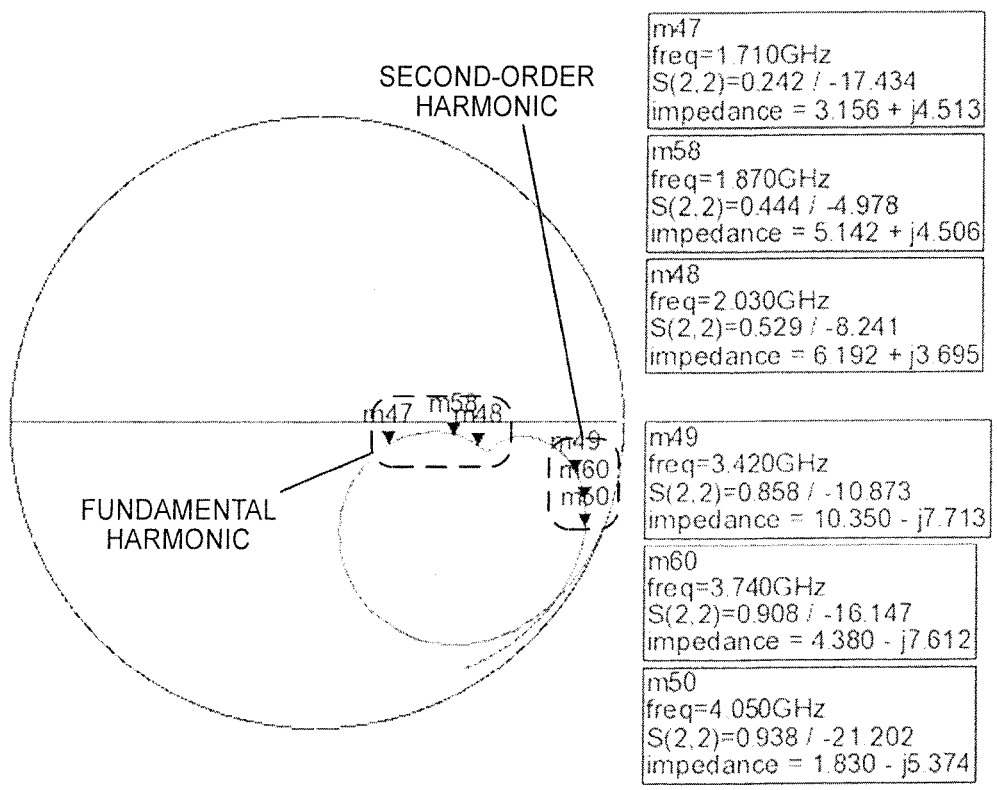
FIG. 27 is a diagram illustrating a simulation result of an example of frequency characteristics of output-side impedance in a configuration in which the output side of the matching circuit 507 of the power amplifier module illustrated in FIG. 5 is provided with a capacitor illustrated in FIG. 24.

First, in order to change the impedance of the second-order harmonics on the output side of the matching circuit 507, a configuration in which a capacitor is disposed on the output side of the matching circuit 507 of the power amplifier module 113 illustrated in FIG. 5 will be reviewed. FIG. 27 is a diagram illustrating a simulation result of an example of frequency characteristics of the output-side impedance in the configuration in which the output side of the matching circuit 507 of the power amplifier module 113 illustrated in FIG. 5 is provided with the capacitor 2410 illustrated in FIG. 24. As illustrated in FIG. 27, by providing the output side of the matching circuit 507 with the capacitor 2410, it is possible to adjust the impedance of the second-order harmonics. However, as illustrated in FIG. 27, the deviation of the impedance of the fundamental harmonics from the center increases and the matching state degrades, in comparison with the configuration illustrated in FIG. 26.

Figure 28:
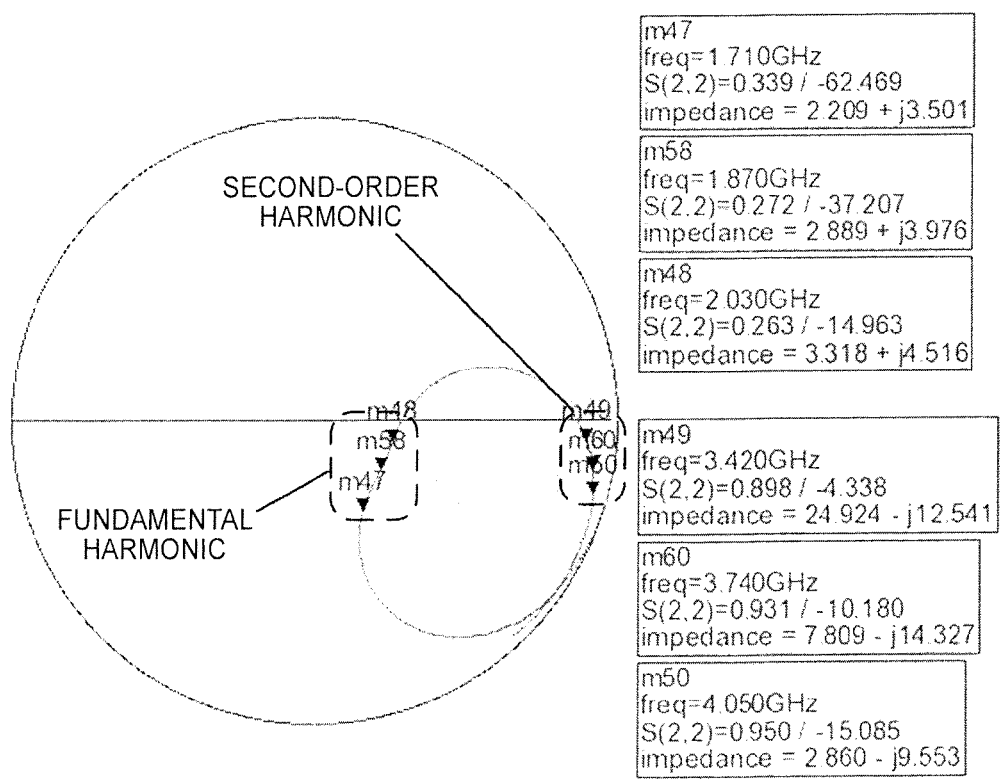
FIG. 28 is a diagram illustrating a simulation result of an example of frequency characteristics of output-side impedance in the matching circuit 507 of the power amplifier module illustrated in FIG. 24.

Therefore, in order to cancel the influence of the fundamental harmonics to the impedance, a configuration in which a capacitor is disposed on the input side as well as the output side of the matching circuit 507 of the power amplifier module 113 illustrated in FIG. 5, that is, the configuration illustrated in FIG. 24, will be reviewed. FIG. 28 is a diagram illustrating a simulation result of an example of frequency characteristics of the output-side impedance in the matching circuit 507 of the power amplifier module 113 illustrated in FIG. 24. In the example illustrated in FIG. 28, three points of 1.710 GHz (m47), 1.870 GHz (m58), and 2.030 GHz (m48) are plotted as impedance of fundamental harmonics. In the example illustrated in FIG. 28, three points of 3.420 GHz (m49), 3.740 GHz (m60), and 4.050 GHz (m50) are plotted as impedance of second-order harmonics.

As illustrated in FIG. 28, the imaginary part of the impedance of the second-order harmonics is closer to −j13 in comparison with the case illustrated in FIG. 26. As illustrated in FIG. 28, the impedance of the fundamental harmonics is present in the vicinity of the center and is close to a matched state, similarly to the case illustrated in FIG. 26. In this way, by disposing the capacitors on the input side and the output side of the matching circuit 507, it is possible to adjust the impedance of the second-order harmonics and to maintain the matched state of the impedance of the fundamental harmonics.

Figure 29:
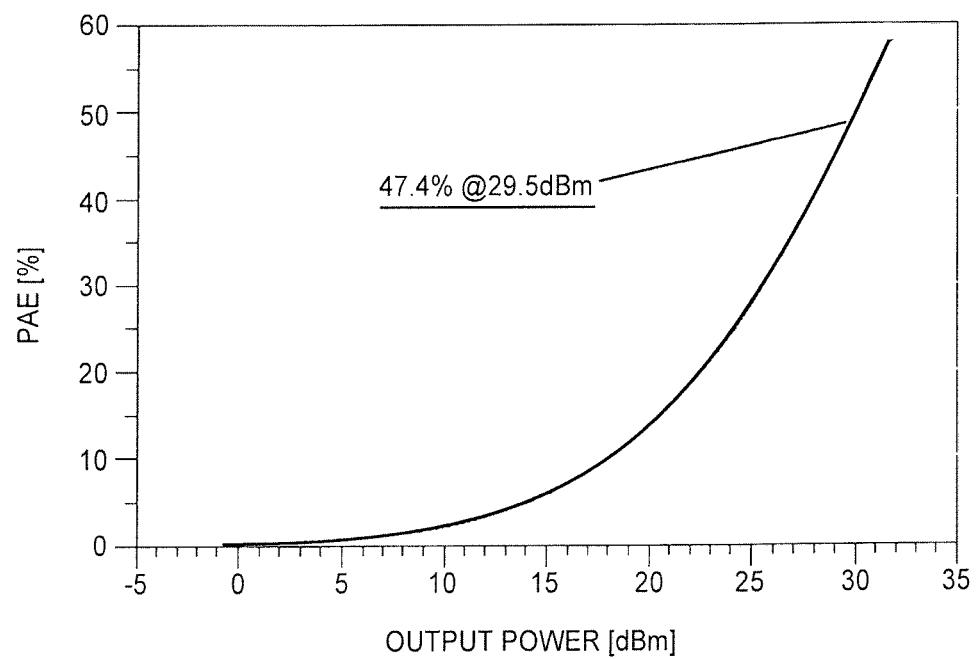
FIG. 29 is a diagram illustrating a simulation result of an example of efficiency of the power amplifier module illustrated in FIG. 24.

FIG. 29 is a diagram illustrating an example of a simulation result of efficiency of the power amplifier module 113 illustrated in FIG. 24. In FIG. 29, the horizontal axis represents the output power (dBm) and the vertical axis represents the PAE (%). In the simulation result illustrated in FIG. 29, the PAE of the power amplifier module 113 illustrated in FIG. 24 is 47.4% at output power of 29.5 dBm. That is, the PAE is improved by 2.6% in comparison with the power amplifier module 113 (of which the PAE at 29.5 dBm is 44.8%) illustrated in FIG. 5.

In this way, by arranging the shunted capacitors 2400 and 2410 before and after the capacitors 510 and 511 in the matching circuit 507, it is possible to improve the efficiency of the power amplifier module 113.

FIG. 24 illustrates the example where the capacitors 2400 and 2410 are arranged before and after the capacitors 510 and 511 in the matching circuit 507 of the power amplifier module 113 illustrated in FIG. 5, but the present invention is not limited to the power amplifier module 113 illustrated in FIG. 5 and the power amplifier modules 113 illustrated in other drawings can also be similarly provided with the capacitors 2400 and 2410.

Figure 30:
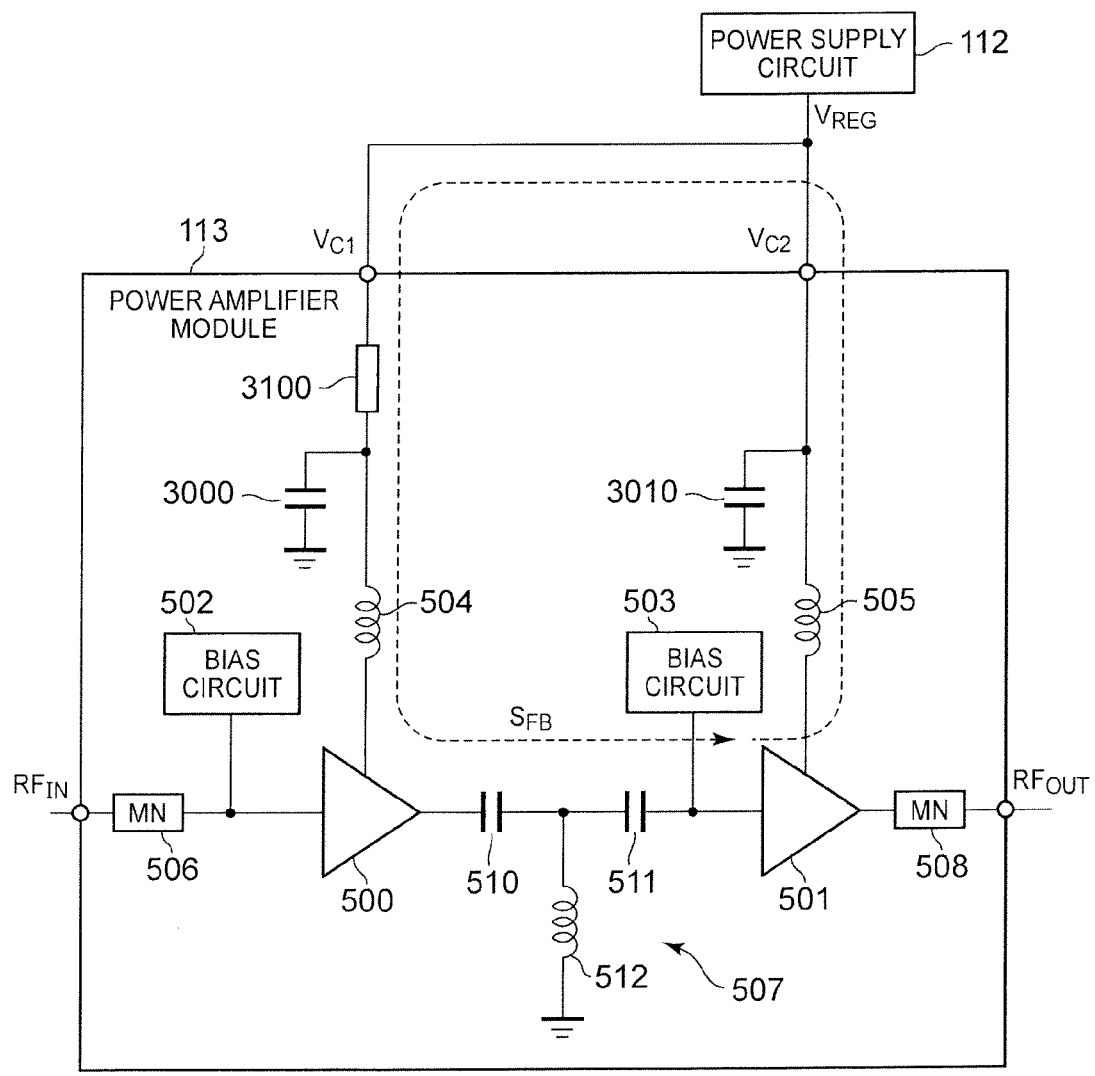
FIG. 30 is a diagram illustrating still another configuration example of the power amplifier module.

FIG. 30 is a diagram illustrating still another configuration example of the power amplifier module 113. The same elements as illustrated in FIG. 5 will be referenced by the same reference signs and description thereof will not be repeated. As illustrated in FIG. 30, the power amplifier module 113 includes capacitors 3000 and 3010 and a ferrite bead 3100 in addition to the elements illustrated in FIG. 5. In the configuration illustrated in FIG. 30, the source voltages of both the power amplifier circuit 500 and the power amplifier circuit 501 are set to the source voltage $V_{REG}$ supplied from the power supply circuit 112. Specifically, the source voltage $V_{REG}$ is supplied to the power amplifier circuit 500 via the power supply terminal $V_{C1}$ (first power supply terminal) and is supplied to the power amplifier circuit 501 via a power supply terminal $V_{C2}$ (second power supply terminal).

One end of the capacitor 3000 is connected to the supply line of the source voltage $V_{REG}$ from the power supply terminal $V_{C1}$ to the power amplifier circuit 500 and the other end thereof is grounded. One end of the capacitor 3010 is connected to the supply line of the source voltage $V_{REG}$ from the power supply terminal $V_{C2}$ to the power amplifier circuit 501 and the other end thereof is grounded. The capacitors 3000 and 3010 are bypass capacitors for removing noise from the supply line of the source voltage $V_{REG}$. The power amplifier module 113 may have a configuration not including the capacitors 3000 and 3010.

The ferrite bead 3100 is arranged on the supply line of the source voltage $V_{REG}$ from the power supply terminal $V_{C1}$ to the power amplifier circuit 500. The ferrite bead 3100 is disposed to improve isolation between the power source of the power amplifier circuit 500 and the power source of the power amplifier circuit 501. This point will be described below.

In the power amplifier module 113 illustrated in FIG. 30, both the power amplifier circuit 500 and the power amplifier circuit 501 are supplied with the source voltage $V_{REG}$. That is, the power supply terminal $V_{C1}$ and the power supply terminal $V_{C2}$ are electrically connected to each other. Accordingly, as indicated by a dotted line in FIG. 30, a closed loop including the input of the power amplifier circuit 501, the output of the power amplifier circuit 501, the power supply terminal $V_{C2}$, power supply terminal $V_{C1}$, the output of the power amplifier circuit 500, and the input of the power amplifier circuit 501 is formed. Since a feedback signal $S_{FB}$ passing through the closed loop and returning to the input of the power amplifier circuit 501 affects the output of the power amplifier module 113, it is preferable that the signal level thereof be small.

In order to decrease the signal level of the feedback signal $S_{FB}$, for example, a configuration in which the capacitance of the capacitor 3000 increases is considered. However, the source voltage $V_{REG}$ is a voltage varying depending on the amplitude level of the RF signal. Accordingly, when the capacitance of the capacitor 3000 increases, the variation of the source voltage $V_{REG}$ slowly propagates to the power amplifier circuit 500 and the effect of envelope tracking control degrades.

Therefore, in the configuration illustrated in FIG. 30, by arranging the ferrite bead 3100 on the supply line of the source voltage $V_{REG}$ from the power supply terminal $V_{C1}$ to the power amplifier circuit 500 instead of increasing the capacitance of the capacitor 3000, the signal level of the feedback signal $S_{FB}$ returning to the input of the power amplifier module 113 decreases.

Figure 31:
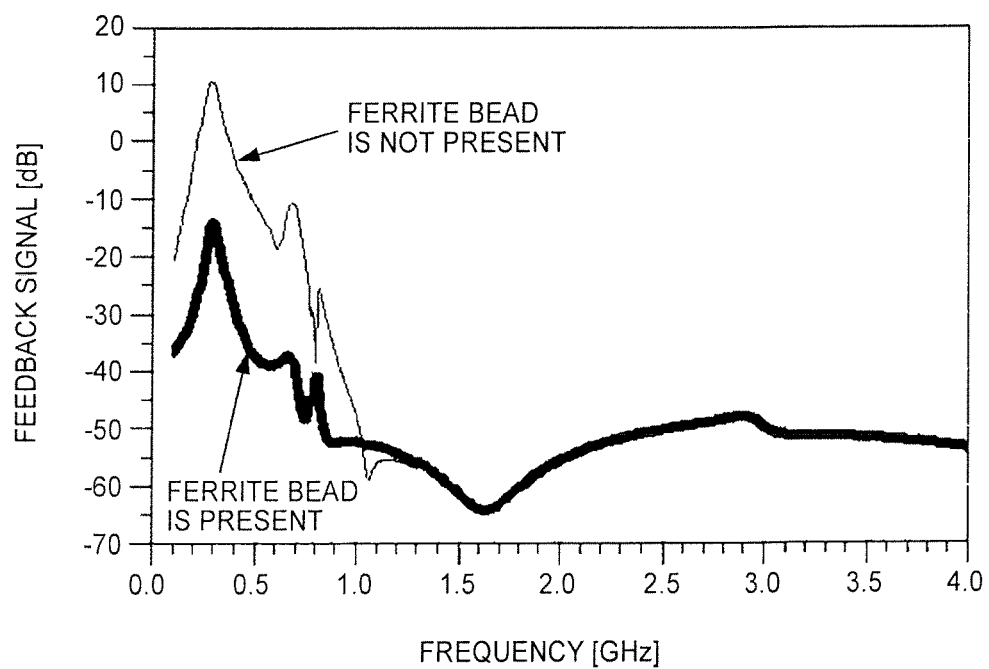
FIG. 31 is a diagram illustrating a simulation result of an example of a signal level of a feedback signal in the power amplifier module illustrated in FIG. 30.

FIG. 31 is a diagram illustrating a simulation result of an example of the signal level of the feedback signal in the power amplifier module illustrated in FIG. 30. In the simulation, the feedback signal from the input of the power amplifier circuit 501 to the capacitor 511 is evaluated. FIG. 31 illustrates the simulation result when the ferrite bead 3100 is present (the configuration illustrated in FIG. 30) and when the ferrite bead 3100 is not present (the configuration in which the ferrite bead is removed from the configuration illustrated in FIG. 30). In FIG. 31, the horizontal axis represents the frequency (GHz) and the vertical axis represents the signal level (dB) of the feedback signal $S_{FB}$. As illustrated in FIG. 31, when the ferrite bead 3100 is present, the signal level of the feedback signal $S_{FB}$ decreases in a relatively low frequency band (for example, 1.0 GHz or less) in comparison with the case where the ferrite bead 3100 is not present. From this simulation result, it can be seen that the signal level of the feedback signal $S_{FB}$ returning to the input of the power amplifier module 113 decreases by arranging the ferrite bead 3100.

In this way, when the source voltage $V_{REG}$ is supplied to both the power amplifier circuit 500 and the power amplifier circuit 501, it is possible to improve isolation between the power source of the power amplifier circuit 500 and the power source of the power amplifier circuit 501 by installing the ferrite bead 3100. In addition, a configuration in which a ferrite bead is installed on the power supply terminal $V_{C2}$ side or a configuration in which ferrite beads are installed on both sides of the power supply terminal $V_{C1}$ and the power supply terminal $V_{C2}$ may be employed. FIG. 30 illustrates the configuration in which the ferrite bead 3100 is added to the power amplifier module 113 illustrated in FIG. 5, but a configuration in which both the power amplifier circuit 500 and the power amplifier circuit 501 are supplied with the source voltage $V_{REG}$ and the ferrite bead 3100 is installed on the power supply line of the power amplifier circuit 500 may be employed by the configurations illustrated in FIGS. 11 to 17 and FIGS. 22 to 24.

This embodiment has been hitherto described. In the power amplifier module 113 according to this embodiment, the matching circuit 507 including the capacitors 510 and 511 and the inductor 512 is disposed between the power amplifier circuits 500 and 501. In the power amplifier module 113, as the source voltage $V_{REG}$ supplied to the power amplifier circuit 501 increases, the base-collector parasitic capacitance $C_{BC}$ of the transistor of the power amplifier circuit 501 decreases and the gain of the power amplifier circuit 501 increases. Accordingly, in the power amplifier module 113, as illustrated in FIGS. 6 to 8, the gain of the power amplifier circuit 500 is made to decrease as the source voltage $V_{REG}$ supplied to the power amplifier circuit 501 increases by the operation of the matching circuit 507. Accordingly, the increase in the gain of the power amplifier circuit 501 is cancelled by the decrease in the gain of the power amplifier circuit 500 and the variation in the gain due to the variation of the source voltage $V_{REG}$ is suppressed in the power amplifier module 113 as a whole. Therefore, it is possible to improve linearity of the power amplifier module 113 without performing complex control of controlling the source voltage $V_{CC}$ of the first-stage power amplifier circuit 500 in addition to the envelope tracking control.

According to this embodiment, the capacitance value of the capacitor 511 in the matching circuit 507 can be set to be larger than the capacitance value of the capacitor 510. In this way, by setting the capacitance value of the capacitor 511 to be larger, it is possible to reduce the influence of the variation in the base-collector parasitic capacitance $C_{BC}$ of the power amplifier circuit 501. Accordingly, it is possible to improve linearity of the power amplifier module 113.

According to this embodiment, as illustrated in FIG. 11, it is possible to decrease the bias to be supplied to the power amplifier circuit 500 as the source voltage $V_{REG}$ increases. Accordingly, it is possible to improve precision of the adjustment gain of the power amplifier circuit 500. Therefore, it is possible to suppress a variation in the gain of the power amplifier module 113 as a whole and thus to improve linearity of the power amplifier module 113.

According to this embodiment, as illustrated in FIG. 12, the power amplifier circuits are installed to form three stages, the source voltage $V_{REG}$ is supplied to the final-stage power amplifier circuit 501, and the bias to be supplied to the first-stage power amplifier circuit 1200 is made to decrease as the source voltage $V_{REG}$ increases. Accordingly, it is possible to suppress the variation in the gain of the power amplifier module 113 as a whole.

According to this embodiment, as illustrated in FIG. 13, the front stage of the power amplifier circuit 500 is provided with the variable attenuator 1300 of which the attenuation rate increases as the source voltage $V_{REG}$ increases. Accordingly, the gain of the power amplifier circuit 501 increasing with the increase of the source voltage $V_{REG}$ is cancelled by the decrease in the gain of the power amplifier circuit 500 and the increase of the attenuation rate of the variable attenuator 1300, and it is thus possible to suppress the variation in the gain of the power amplifier module 113 as a whole.

According to this embodiment, as illustrated in FIG. 14, the bias to be supplied to the power amplifier circuit 500 decreases as the amplitude level of the RF signal increases. Accordingly, it is possible to improve the adjustment precision of the gain of the power amplifier circuit 500. As a result, it is possible to suppress the variation in the gain of the power amplifier module 113 as a whole and to improve the linearity of the power amplifier module 113.

According to this embodiment, as illustrated in FIG. 15, the power amplifier circuits are installed to form three stages, the source voltage $V_{REG}$ is supplied to the final-stage power amplifier circuit 501, and the bias to be supplied to the first-stage power amplifier circuit 1200 is made to decrease as the amplitude level of the RF signal increases. Accordingly, it is possible to suppress the variation in the gain of the power amplifier module 113 as a whole.

According to this embodiment, as illustrated in FIG. 16, the front stage of the power amplifier circuit 500 is provided with the variable attenuator 1600 of which the attenuation rate increases as the amplitude level of the RF signal increases. Accordingly, the amplitude level of the RF signal increases, and the gain of the power amplifier circuit 501 increasing with the increase of the source voltage $V_{REG}$ is cancelled by the decrease in the gain of the power amplifier circuit 500 and the increase of the attenuation rate of the variable attenuator 1600, and it is thus possible to suppress the variation in the gain of the power amplifier module 113 as a whole.

According to this embodiment, as illustrated in FIG. 17, when the inductor 512 for the matching circuit is connected to the terminal 1703 of the power amplifier IC 1700, it is possible to increase the voltage of the cathode of the protection diode 1702 by the use of the capacitor 1701. Accordingly, it is possible to suppress energy loss due to the forward current flowing in the protection diode 1702.

According to this embodiment, the capacitance value of the capacitor 1701 connected in series to the inductor 512 can be set to be larger than the capacitance values of the capacitors 510 and 511. Accordingly, the resonance frequency is shifted to a lower side and it is thus possible to suppress the influence of addition of the capacitor 1701 to the RF signal.

According to this embodiment, as illustrated in FIG. 23, the resistor 2300 is installed to be connected between the node between the capacitors 510 and 511 and the ground. Accordingly, it is possible to prevent destruction of the capacitors 510 and 511 due to the voltage increased by the capacitor 1701.

According to this embodiment, as illustrated in FIG. 24, by installing the shunted capacitors 2400 and 2410 before and after the capacitors 510 and 511 in the matching circuit 507, it is possible to improve the efficiency of the power amplifier module 113.

According to this embodiment, as illustrated in FIG. 30, in the configuration in which a source voltage $V_{REG}$ for envelope tracking control is supplied to both the power amplifier circuit 500 and the power amplifier circuit 501, it is possible to improve isolation between the power source of the power amplifier circuit 500 and the power source of the power amplifier circuit 501 by providing the ferrite bead 3100 to the power supply line of the power amplifier circuit 500.

This embodiment is for easily understanding the present invention but is not for defining the present invention. The present invention can be modified and improved insofar as there is no departure from the gist thereof, and the equivalents thereof belong to the scope of the present invention.

REFERENCE SIGNS LIST

100: transmitter unit
110: baseband unit
111: RF unit
112: power supply circuit
113: power amplifier module
114: front end unit
115: antenna
200, 201: delay circuit
202: RF modulation unit
203: amplitude level detecting unit
204: distortion compensating unit
205: DAC
500, 501, 1200: power amplifier circuit
502, 503: bias circuit
504, 505, 512: inductor
506 to 508, 1202, 1301: matching circuit
510, 511, 1701, 2400, 2410, 3000, 3010: capacitor
1100, 1203, 1400, 1500: variable bias circuit
1300, 1600: variable attenuator
1700: power amplifier IC
1703: terminal
2300: resistor
3100: ferrite bead

What is claimed is:

1. A power amplifier module comprising:
   a first power amplifier circuit configured to amplify a radio frequency signal and output a first amplified signal;
   a second power amplifier circuit configured to amplify the first amplified signal on the basis of a source voltage varying depending on amplitude of the radio frequency signal and output a second amplified signal; and
   a matching circuit configured to include:
      first and second capacitors connected in series between the first and second power amplifier circuits, an inductor connected between a node between the first and second capacitors and a ground,
      a fourth capacitor connected between a node between the first power amplifier circuit and the first capacitor and the ground, and
      a fifth capacitor connected between a node between the second capacitor and the second power amplifier circuit and the ground,
   the matching circuit further configured to decrease a gain of the first power amplifier circuit as the source voltage of the second power amplifier circuit increases.

2. The power amplifier module according to claim 1, wherein a capacitance value of the second capacitor is greater than a capacitance value of the first capacitor.

3. The power amplifier module according to claim 1, further comprising a bias circuit configured to supply a bias to the first power amplifier circuit, the bias decreasing as the source voltage increases.

4. The power amplifier module according to claim 1, further comprising:
   a third power amplifier circuit disposed in a front stage of the first power amplifier circuit; and
   a bias circuit configured to supply a bias to the third power amplifier circuit, the bias decreasing as the source voltage increases.

5. The power amplifier module according to claim 1, further comprising a variable attenuator disposed in a front stage of the first power amplifier circuit and having an attenuation rate increasing as the source voltage increases.

6. The power amplifier module according to claim 1, further comprising a bias circuit configured to supply a bias to the first power amplifier circuit, the bias decreasing as amplitude of the radio frequency signal increases.

7. The power amplifier module according to claim 1, further comprising:
   a third power amplifier circuit disposed in a front stage of the first power amplifier circuit; and
   a bias circuit configured to supply a bias to the third power amplifier circuit, the bias decreasing as amplitude of the radio frequency signal increases.

8. The power amplifier module according to claim 1, further comprising a variable attenuator disposed in a front stage of the first power amplifier circuit and having an attenuation rate increasing as amplitude of the radio frequency signal increases.

9. A power amplifier module comprising:
   a first power amplifier circuit configured to amplify a radio frequency signal and output a first amplified signal;
   a second power amplifier circuit configured to amplify the first amplified signal on the basis of a source voltage varying depending on amplitude of the radio frequency signal and output a second amplified signal;
   a matching circuit configured to include:
      first and second capacitors connected in series between the first and second power amplifier circuits, and an inductor connected between a node between the first and second capacitors and a ground; and
   a third capacitor connected in series to the inductor,
   wherein the first and second power amplifier circuits and the first and second capacitors are formed on a single chip, and
   wherein the single chip includes:
      a terminal configured to be used to connect the inductor and the third capacitor to the node between the first and second capacitors; and
      a protection diode connected between the node between the first and second capacitors and the ground and configured to absorb static electricity intruding from the terminal.

10. The power amplifier module according to claim 9, wherein a capacitance value of the third capacitor is greater than capacitance values of the first and second capacitors.

11. The power amplifier module according to claim 9, further comprising a resistor connected between the node between the first and second capacitors and the ground.

12. The power amplifier module according to claim 1, further comprising:
   a first power supply terminal configured to be used to supply the source voltage to the first power amplifier circuit;
   a second power supply terminal configured to be used to supply the source voltage to the second power amplifier circuit; and
   a ferrite bead disposed in a supply line of the source voltage from the first power supply terminal to the first power amplifier circuit.

13. The power amplifier module according to claim 2, wherein the capacitance value of the second capacitor is approximately two to three times larger than the capacitance value of the first capacitor.

14. The power amplifier module according to claim 9, further comprising:
   a first power supply terminal configured to be used to supply the source voltage to the first power amplifier circuit;
   a second power supply terminal configured to be used to supply the source voltage to the second power amplifier circuit; and
   a ferrite bead disposed in a supply line of the source voltage from the first power supply terminal to the first power amplifier circuit.

15. The power amplifier module according to claim 9, wherein the matching circuit further includes:
   a fourth capacitor connected between a node between the first power amplifier circuit and the first capacitor and the ground; and
   a fifth capacitor connected between a node between the second capacitor and the second power amplifier circuit and the ground.

16. The power amplifier module according to claim 15, further comprising:
   a first power supply terminal configured to be used to supply the source voltage to the first power amplifier circuit;
   a second power supply terminal configured to be used to supply the source voltage to the second power amplifier circuit; and a ferrite bead disposed in a supply line of the source voltage from the first power supply terminal to the first power amplifier circuit.

\* \* \* \* \*

UNITED STATES PATENT AND TRADEMARK OFFICE
CERTIFICATE OF CORRECTION

PATENT NO. : 9,461,602 B2
APPLICATION NO. : 14/327779
DATED : October 4, 2016
INVENTOR(S) : Kiichiro Takenaka et al.

It is certified that error appears in the above-identified patent and that said Letters Patent is hereby corrected as shown below:

In the Specification

Column 3, Line 66, replace "$D_{REG}$" with -- $V_{REG}$ --.

Column 8, Line 43, replace "$D_{REG}$" with -- $V_{REG}$ --.

Signed and Sealed this
Seventeenth Day of April, 2018

Andrei Iancu
*Director of the United States Patent and Trademark Office*